(12) United States Patent
Kouzuki et al.

(10) Patent No.: US 7,253,507 B2
(45) Date of Patent: Aug. 7, 2007

(54) SEMICONDUCTOR DEVICE

(75) Inventors: Shigeo Kouzuki, Kanagawa (JP); Satoshi Aida, Kanagawa (JP); Satoshi Yanagisawa, Kanagawa (JP); Masaru Izumisawa, Kanagawa (JP); Hironori Yoshioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 279 days.

(21) Appl. No.: 10/975,356

(22) Filed: Oct. 29, 2004

(65) Prior Publication Data
US 2005/0194638 A1 Sep. 8, 2005

(30) Foreign Application Priority Data
Mar. 3, 2004 (JP) ............................. 2004-058948

(51) Int. Cl.
*H01L 23/045* (2006.01)
(52) U.S. Cl. .................. 257/678; 257/735; 257/692
(58) Field of Classification Search ................ 257/735, 257/692, 690, 678, 688, 689, 693, 734, 773

See application file for complete search history.

(56) References Cited

U.S. PATENT DOCUMENTS

| | | | |
|---|---|---|---|
| 6,740,931 B2 | 5/2004 | Kouzuki et al. | |
| 6,979,889 B2 * | 12/2005 | Jiang et al. | 257/676 |
| 2006/0113656 A1 * | 6/2006 | Uang et al. | 257/690 |

* cited by examiner

*Primary Examiner*—Douglas W. Owens
(74) *Attorney, Agent, or Firm*—Oblon, Spivak, McClelland, Maier & Neustadt, P.C.

(57) ABSTRACT

A semiconductor device comprises a semiconductor element and a conductive member. The semiconductor element has a semiconductor substrate having first and second major surfaces; a semiconductor layer formed on the first major surface of the semiconductor substrate; a plurality of trenches formed on the semiconductor layer, the trenches being parallel to each other and extending to a first direction; filling material filling the trenches; a first electrode pad provided on the semiconductor layer and connected electrically to a first major electrode; a second major electrode provided on the second major surface; and a gate electrode pad provided on the semiconductor layer and connected to a gate electrode which controls conduction between the first major electrode and the second major electrode. The conductive member is connected to at least one of the first electrode pad and the gate electrode pad via a first contact area. A leading-out direction of the conductive member is substantially parallel to the first direction.

10 Claims, 25 Drawing Sheets

SEMICONDUCTOR DEVICE

CROSS-REFERENCE TO RELATED APPLICATIONS

This application is based upon and claims the benefit of priority from the prior Japanese Patent Application No. 2004-058948, filed on Mar. 3, 2004; the entire contents of which are incorporated herein by reference.

BACKGROUND OF THE INVENTION

The present invention relates to a semiconductor device, and more particularly, it relates to a semiconductor device which has MIS (Metal-Insulator-Semiconductor) gate type structure.

A power metal-oxide semiconductor field effect transistor is one of the semiconductor devices which have MIS gate type structure. The demand of the power metal-oxide semiconductor field effect transistor as a switching element, for example, in the circuit for charge and discharge of a lithium ion battery etc. is increasing sharply. The power metal-oxide semiconductor field effect transistor is required to have a high breakdown voltage in a power use, and further, it is needed to have a lower ON resistance in order to control electric power loss. Especially, in the case where the power metal-oxide semiconductor field effect transistor is used for a battery drive type portable device etc., it is an urgent requirement to lower the power consumption of the circuit by lowering the ON resistance.

FIG. 24 is a schematic section view showing the element structure of the principal part of DT (Deep Trench) type power metal-oxide semiconductor field effect transistor (hereafter, abbreviated as "DTMOS"), as, for example, disclosed by Japanese Patent Laid-Open Publication No, 2002-170955. That is, DTMOS 10 has a structure where n-type pillar regions 12 and p-type pillar regions 14 are provided in parallel on an $n^{++}$ type silicon substrate 11. And trenches 16 filled up with insulators are provided adjoining these n-types pillar regions. Depths D of the trenches 16 are about 60 micrometers, for example. And, a width W of the n-type pillar region 12 and the p-type pillar region 14 sandwiched between a pair of the trenches 16, is about 10 micrometers, for example.

FIG. 25 is a schematic diagram illustrating a plane arrangement of the trenches 16. A size L of one side of a chip DTMOS 10 is about 5 mm. By providing the trenches 16 in parallel and adjoining as illustrated in FIG. 25, it becomes possible to raise the current density of an element and to carry out switching of large current.

In FIG. 24 again, a p-type base region 20 is provided in a planar fashion on the p-type pillar region 14. And, a $p^+$ type base region 22 is provided in a planar fashion on the surface of the p-type base region 20. Furthermore, n+ type source regions 24 are provided in the ends of the surface of the $p^+$ type base region 22.

The regions from the n-type pillar regions 12 to the $n^+$ type source regions 24 through the p-type base regions 20 are covered with the gate insulating films 30, and the gate electrodes 32 are laminated on the gate insulating films 30. Moreover, the circumferences and the upper surfaces of the gate electrodes 32 are protected by the insulating interlayer films.

The n-type pillar regions 12 are the paths of the main current which flows through the element by applying ON voltage to the gate electrodes 32. Therefore, ON resistance can be lowered by making impurities concentrations of the n-type pillar regions 12 high. On the other hand, the breakdown voltage of the element can be maintained by the depletion layers extended in a transverse direction from the p-n junctions between the n-type pillar regions 12 and the p-type pillar regions 14, and the trenches 16 embedded by the insulator. That is, by providing the trenches 16 filled up with the insulator, the widths of the n-type pillar regions 12 and the p-type pillar regions 14 can be narrowed, and the n-type pillar regions 12 and the p-type pillar regions 14 can be depleted completely. Consequently, the current paths of the element of the depleted regions and the current paths of the element of the insulated regions can be intercepted completely, and a high breakdown voltage can be realized. That is, DTMOS illustrated in FIG. 24 is power metal-oxide semiconductor field effect transistor compatible with the fall of ON resistance and the rise of the breakdown voltage.

However, as a result of an examination by the Inventors of the present invention, it turned out that it is desirable to give a peculiar feature in the lead-outing structure of wirings in the case where the semiconductor device provided such DTMOS in its package is manufactured from a viewpoint of reliability and a manufacture yield.

SUMMARY OF THE INVENTION

According to an embodiment of the invention, there is provided a semiconductor device comprising:
a semiconductor element having:
   a semiconductor substrate having first and second major surfaces;
   a semiconductor layer formed on the first major surface of the semiconductor substrate;
   a plurality of trenches formed on the semiconductor layer, the trenches being parallel to each other and extending to a first direction;
   filling material filling the trenches;
   a first electrode pad provided on the semiconductor layer and connected electrically to a first major electrode;
   a second major electrode provided on the second major surface; and
   a gate electrode pad provided on the semiconductor layer and connected to a gate electrode which controls conduction between the first major electrode and the second major electrode; and
a conductive member connected to at least one of the first electrode pad and the gate electrode pad via a first contact area, a leading-out direction of the conductive member being substantially parallel to the first direction.

According to other embodiment of the invention, there is provided a semiconductor device comprising:
a semiconductor element having:
   a semiconductor substrate having first and second major surfaces;
   a semiconductor layer formed on the first major surface of the semiconductor substrate;
   a plurality of trenches formed on the semiconductor layer, the trenches being parallel to each other and extending to a first direction;
   filling material filling the trenches;
   a first electrode pad provided on the semiconductor layer and connected electrically to a first major electrode;
   a second major electrode provided on the second major surface; and a gate electrode pad provided on the semiconductor layer and connected to a gate electrode which controls conduction between the first major electrode and the second major electrode; and a conductive member connected to at least one of the first electrode pad and the gate electrode pad via a first contact area, an angle between a leading-out direction of the conductive member and the first direction being equal to or less than 45 degrees.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

Figure 1:
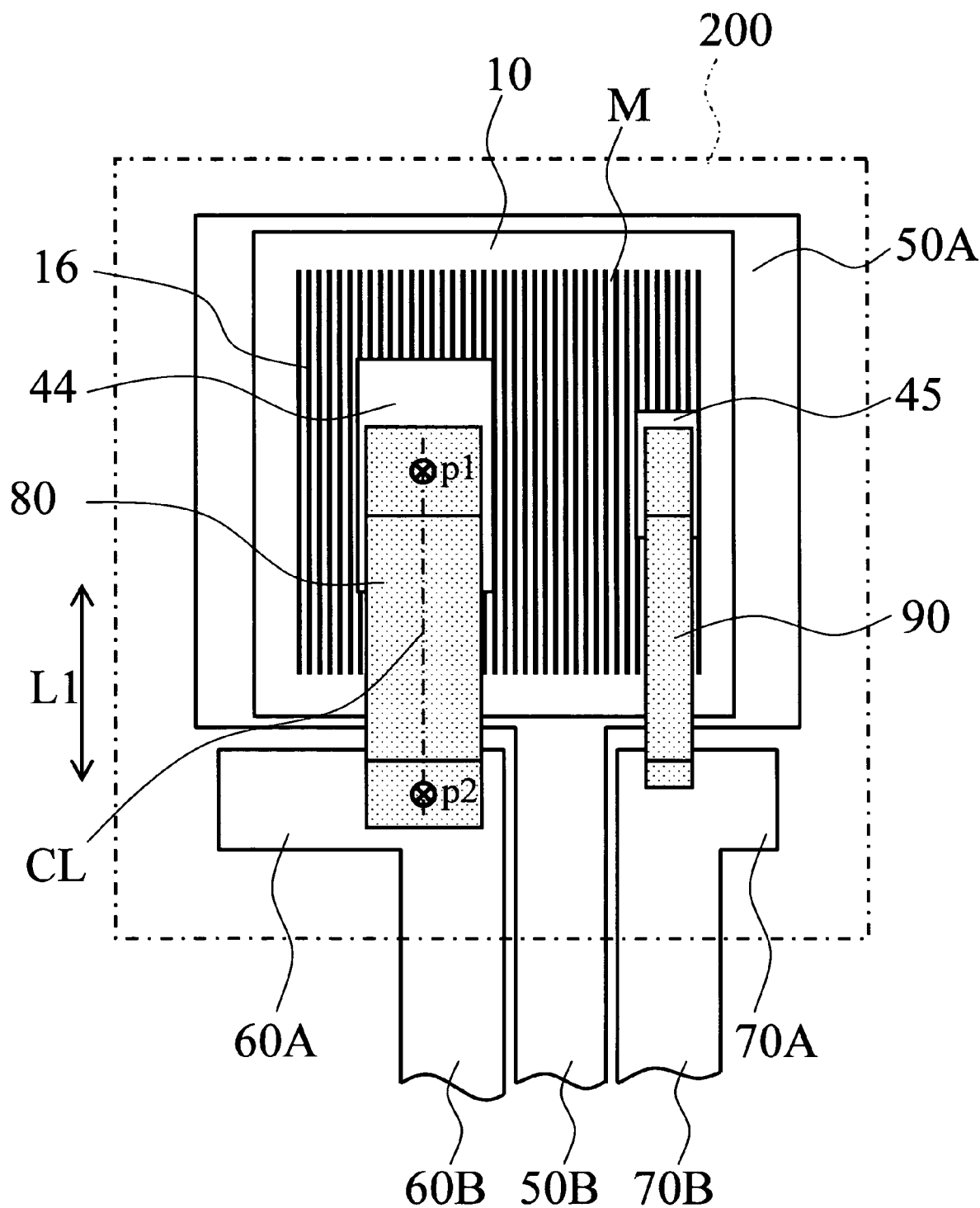
FIG. 1 is a schematic plan view illustrating the principal part structure of the semiconductor device according to the embodiment of the invention.

FIG. 1 is a schematic plan view illustrating the principal part structure of the semiconductor device according to the embodiment of the invention.

Figure 2:
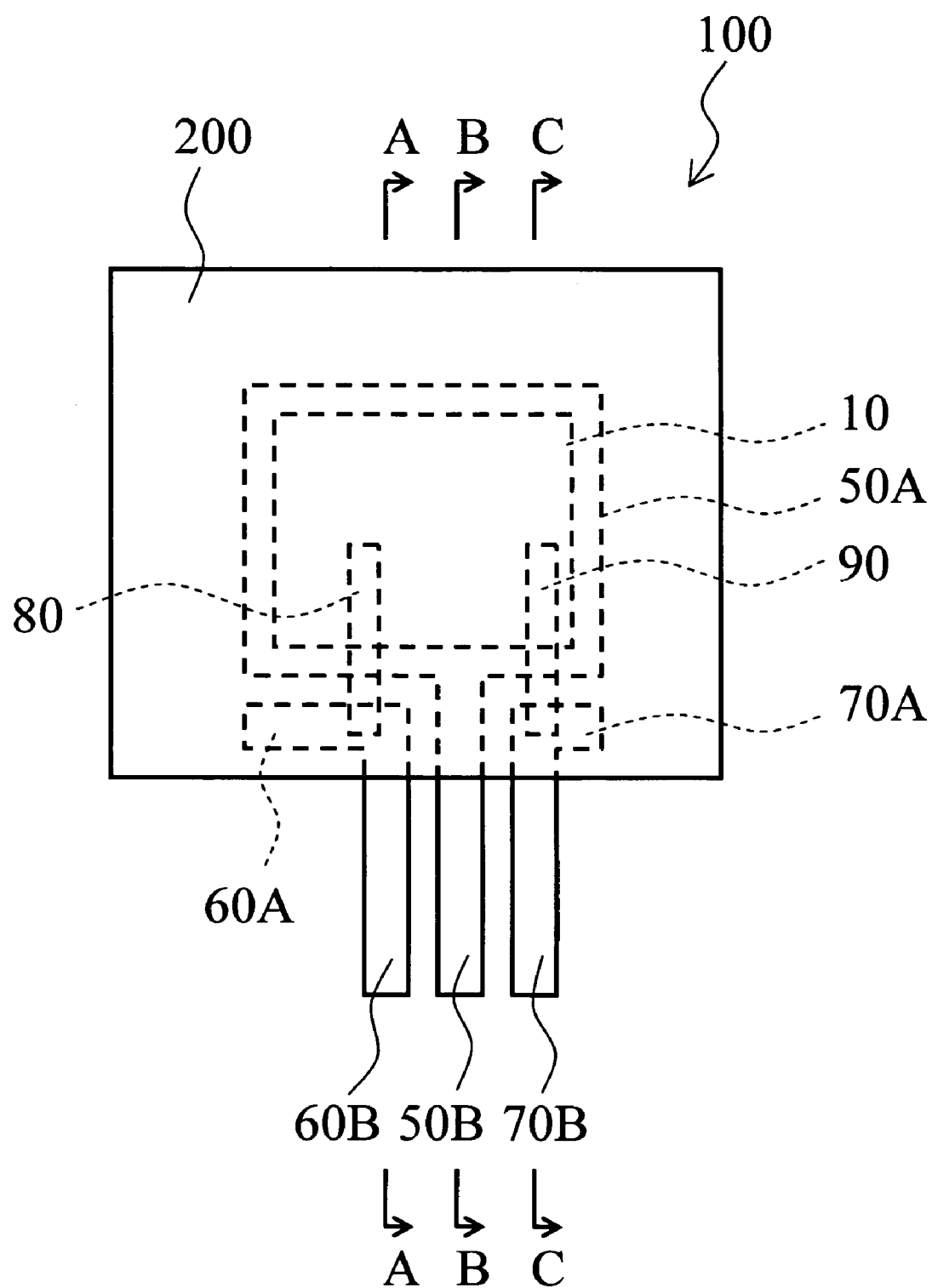
FIG. 2 is a schematic plan view illustrating the structure of this whole semiconductor device.

FIG. 2 is a schematic plan view illustrating the whole structure of the semiconductor device.

Figure 3:
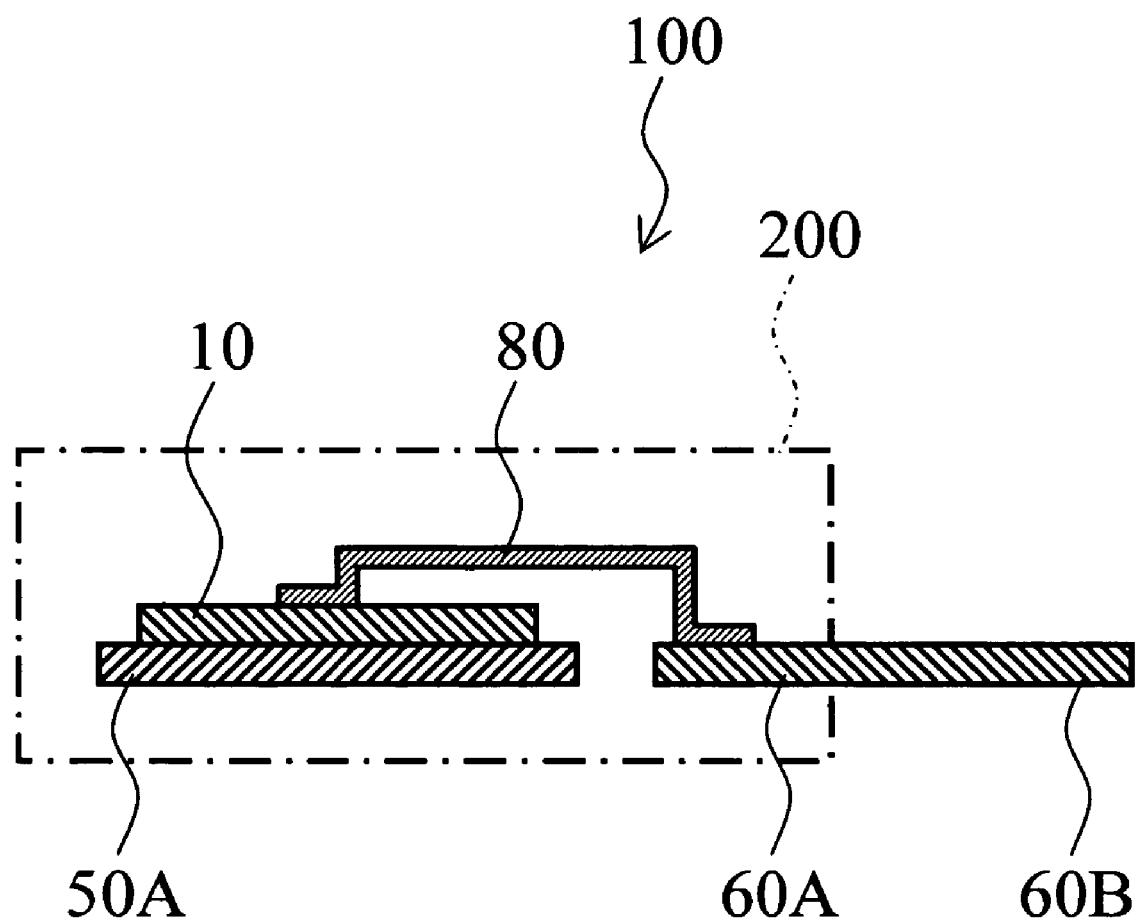
FIG. 3 is a section view on A-A line in FIG. 2.
Figure 4:
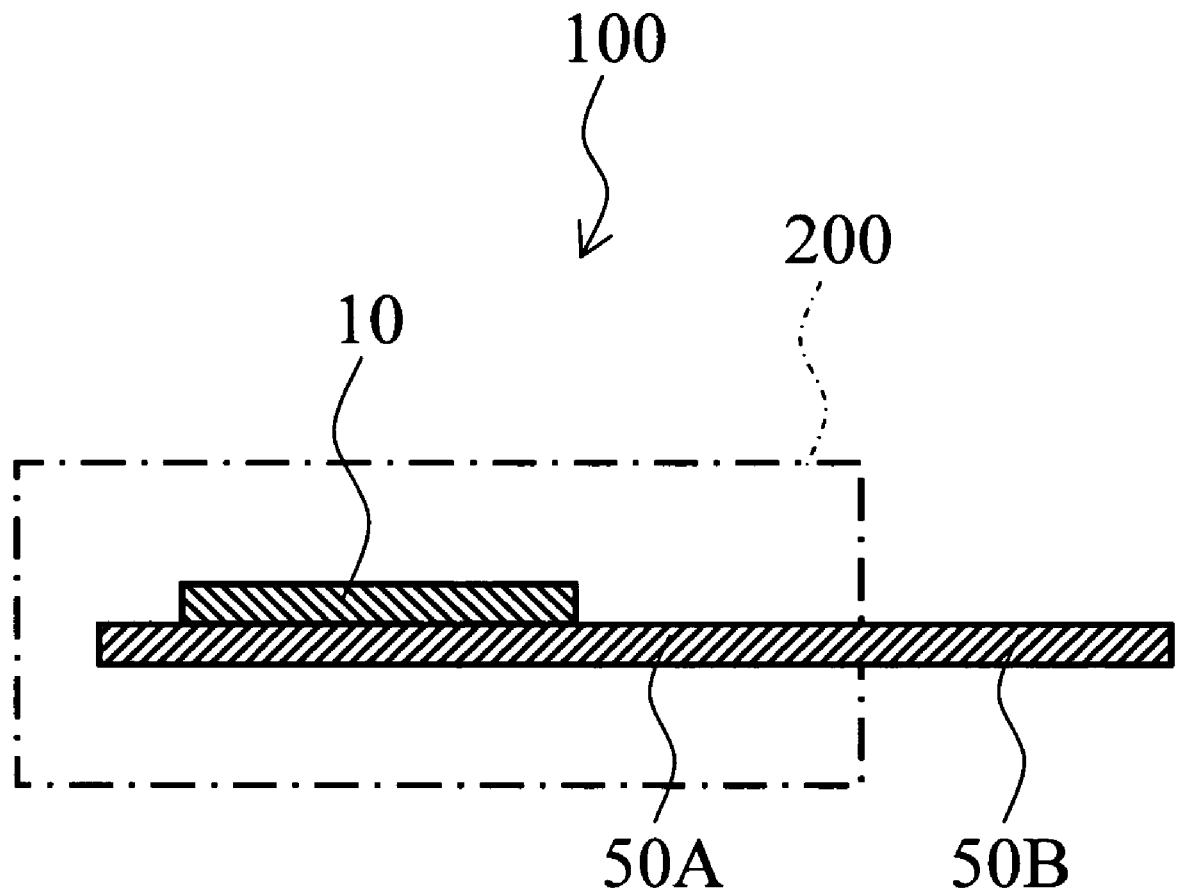
FIG. 4 is a section view on B-B line in FIG. 2.
Figure 5:
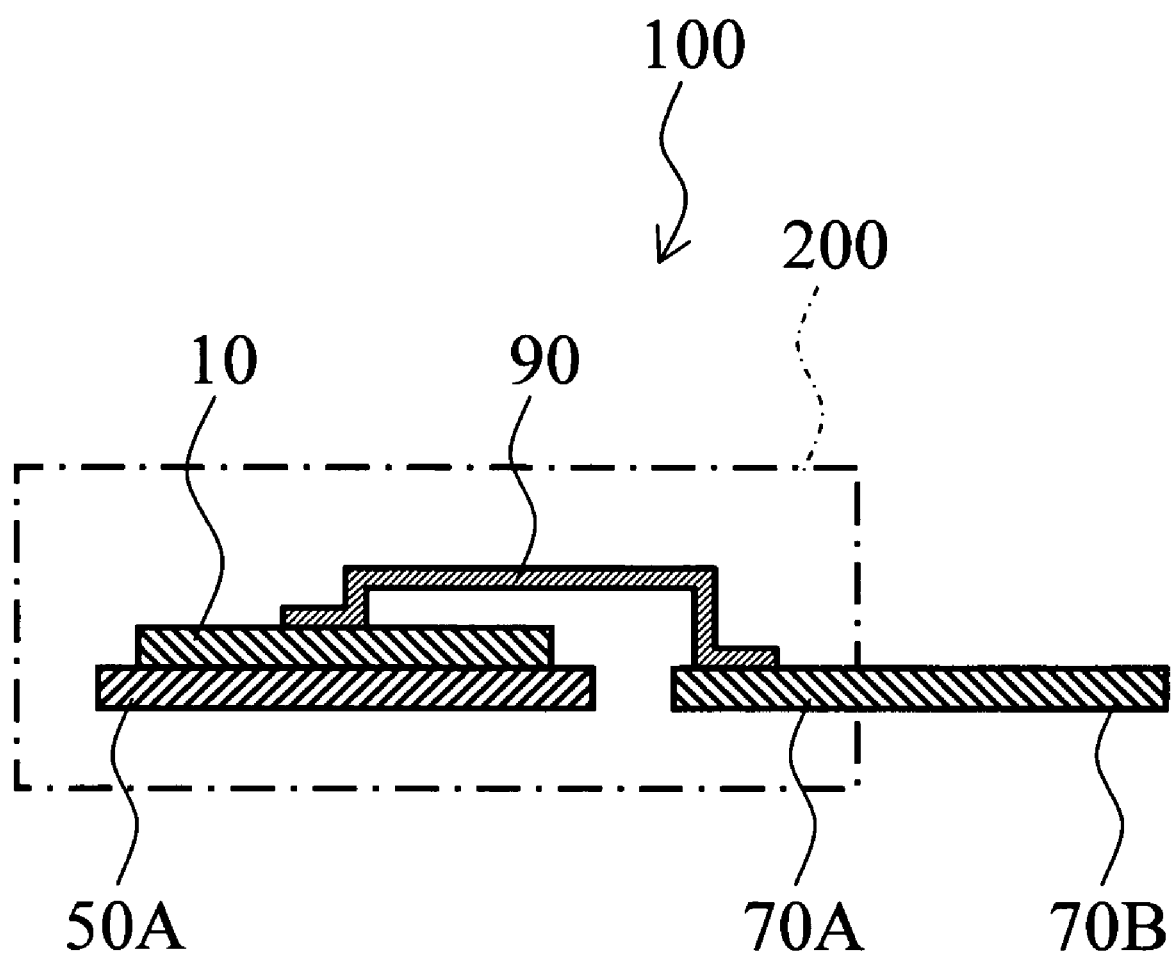
FIG. 5 is a section view on C-C line in FIG. 2.

Furthermore, FIG. 3 through FIG. 5 are section views on A-A line in FIG. 2, on B-B line in FIG. 2, and on C-C line in FIG. 2, respectively.

The semiconductor device of this embodiment can be fabricated by mounting a semiconductor element 10 on a lead frame, and by sealing the semiconductor element 10 with a resin 200. The lead frame has inner leads 50A, 60A, and 70A sealed in the resin 200, and outer leads 50B, 60B, and 70B which extend outside the resin 200.

Figure 24:
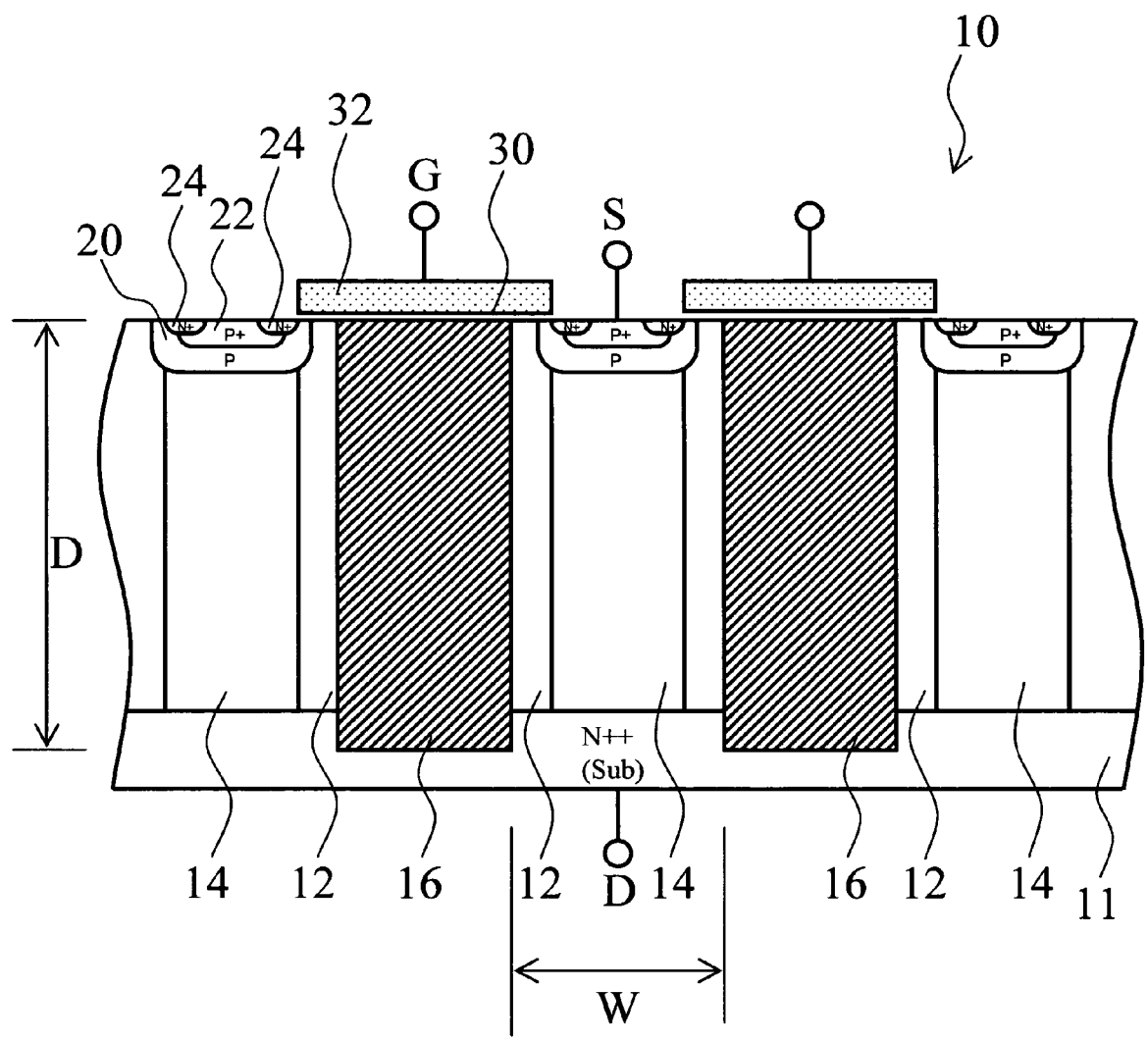
FIG. 24 is a schematic section view showing the element structure of the principal part of DTMOS.
Figure 25:
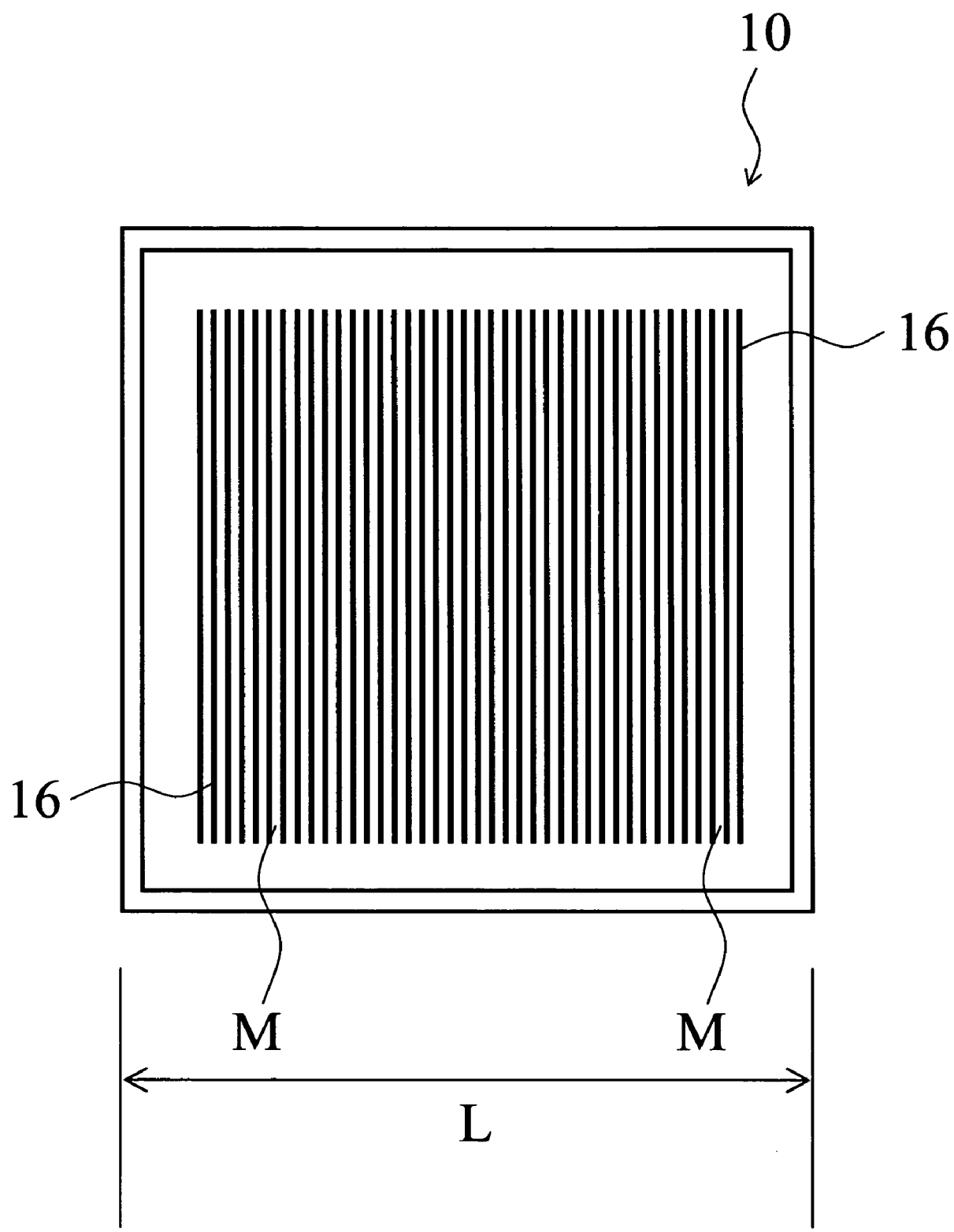
FIG. 25 is a schematic diagram illustrating a plane arrangement of the trenches 16.

The semiconductor element 10 is typically a DTMOS mentioned above about FIGS. 24 and 25. And, a source electrode pad 44 and a gate electrode pad 45 are provided on the surface of the semiconductor element 10, and a drain electrode (not shown) is provided on the back of the semiconductor element 10. The semiconductor element 10 is mounted on the inner lead 50A via the drain electrode. The source electrode pad 44 and the inner lead 60A are connected by a source plate 80. The gate electrode pad 45 and inner lead 70A are connected by the gate plate 90. The source plate 80 and the gate plate 90 can be thin plates consisted of such as copper (Cu) and aluminum (Al), as explained in full detail later. Although trenches 16 are schematically expressed in FIG. 1 in order to make an understanding easy, a protective film covers the surface of the semiconductor element 10 in an actual device.

In this embodiment, leading-out directions of the source plate 80 and the gate plate 90 are substantially parallel to the longitudinal direction of the trenches 16. That is, the source plate 80 and the gate plate 90 in a stripe fashion are lead-out in a direction of an arrow L1 in FIG. 1. And the trenches 16 of the semiconductor element 10 are also extended in the direction of the arrow L1.

Moreover, in the case of this example, the direction of the straight line CL which connects the barycenter p1 of the contact area between the source electrode pad 44 and the source plate 80, and the barycenter p2 of the contact area between the inner lead 60A and the source plate 80 is parallel to a direction in which the trenches 16 extend. The same may be said about the gate plate 90. In addition, the "leading-out direction" in the invention is not necessarily in a same direction as the longitudinal direction of the source plate 80 or the gate plate 90. For example, the source plate 80 and the gate plate 90 may not be straight as will be explained later referring to FIG. 23. In such a case, a "leading-out direction" is determined by the shape of the contact area of the source plate 80 or the gate plate 90, with the source electrode pad 44 or the gate electrode pad 45. That is, the direction extending from the contact area between the source plate 80 or the gate plate 90 and the source electrode pad 44 or the gate electrode pad 45 can be determined as the "leading-out direction."

Figure 6:
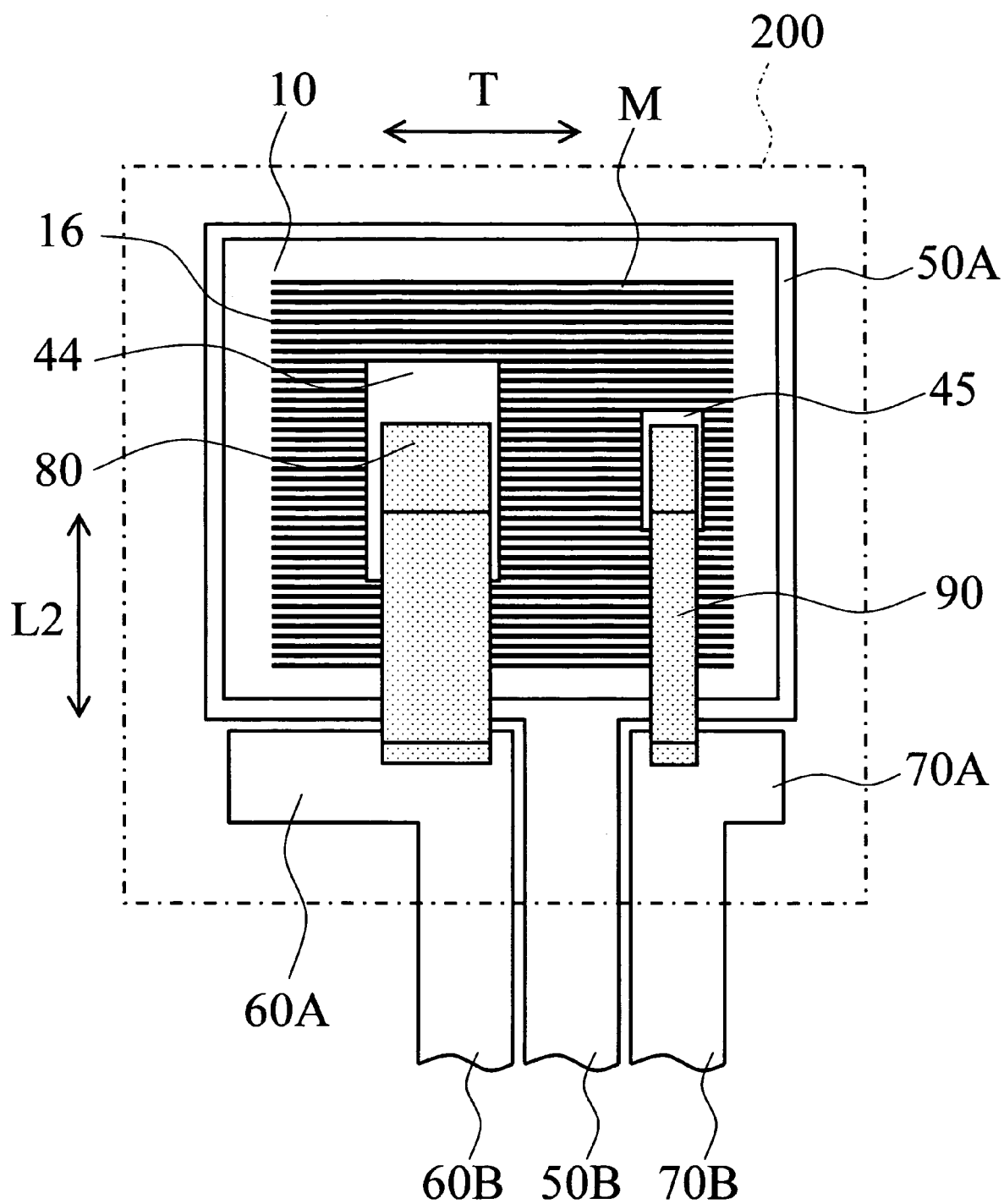
FIG. 6 is a schematic plan view showing the principal part of the semiconductor device of the comparative example which Inventors made as an experiment.

FIG. 6 is a schematic plan view showing the principal part of the semiconductor device of the comparative example which Inventors have manufactured as an experiment. The same symbols are given to the same elements as what were mentioned above with references to FIG. 1 through FIG. 5 about this figure, and detailed explanation will be omitted.

In this comparative example, the leading-out direction L2 of the source plate 80 and the gate plate 90 are substantially perpendicular to the longitudinal direction T of the trenches 16. It turned out that mechanical load becomes easy to be applied to the semiconductor mesa part inserted into the trenches 16 of the semiconductor element 10 when such an arrangement relation was adopted, and there is room of an improvement with respect to reliability or a manufacturing yield. In contrast to this, if the leading-out direction of the source plate 80 and the gate plate 90 are substantially parallel to the longitudinal direction of the trenches 16 as expressed in FIG. 1, the load to a semiconductor element 10 will be reduced and it will become advantageous with respect to reliability or the manufacture yield. This point will be explained in full detail later.

Hereafter, a wiring structure of the semiconductor element 10 of this embodiment will be explained in more detail.

Figure 7:
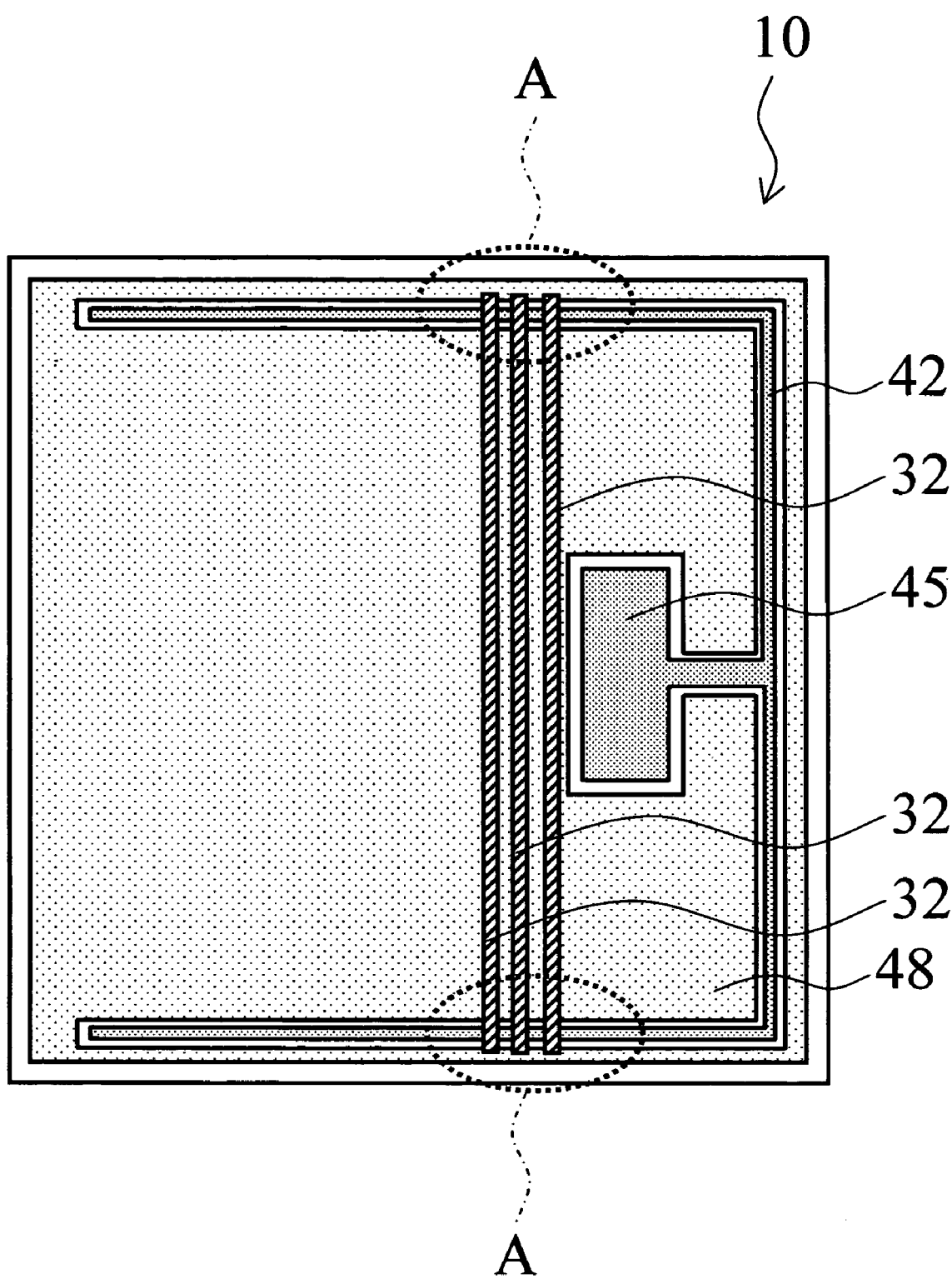
FIG. 7 is a schematic plan view which illustrates a plane view of gate wiring including a fluoroscopy part.

FIG. 7 is a partly transparent schematic plan view which illustrates a plane view of gate wiring.

Figure 8:
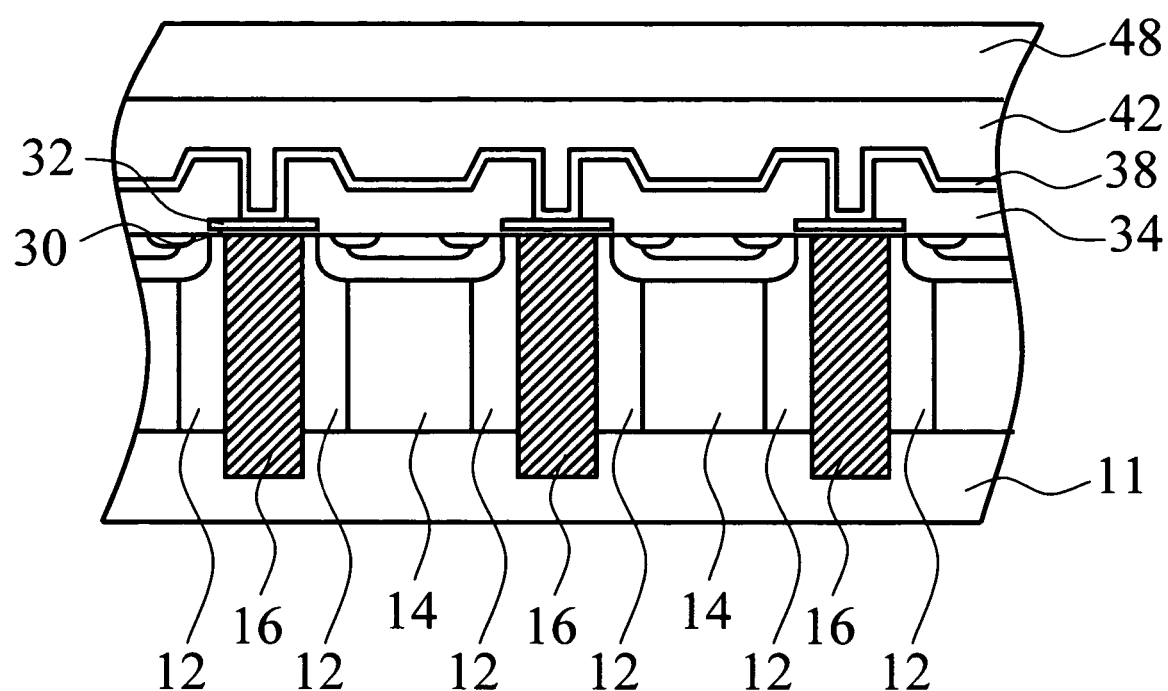
FIG. 8 is a sectional view enlarging a part of A in FIG. 7.

FIG. 8 is a sectional view enlarging a part of A in FIG. 7. In FIG. 7, in order to make an understanding easy, only one part of a plurality of gate electrodes 32 is expressed.

The gate electrodes 32 extend in substantially parallel direction to the trenches 16, as mentioned above about FIG. 24. In order to lead out the wiring from these gate electrodes 32, the gate wiring 42 can be formed in the circumference of the element as expressed in FIG. 7, and gate contacts can be provided in the both ends (portion of Symbol A) of the gate electrode extending. In an area of the gate contact, as expressed in FIG. 8, contact openings are provided in an insulating interlayer film 34, and the gate wiring layer 42 is connected to the gate electrode 32 through the barrier metal layer 38. On the gate wiring layer 42, the protective film 48 which consists of polyimide etc. is provided. As expressed in FIG. 7, the gate wiring layer 42 is formed along the circumference of the semiconductor element 10, and is connected to the gate electrode pad 45.

Figure 9:
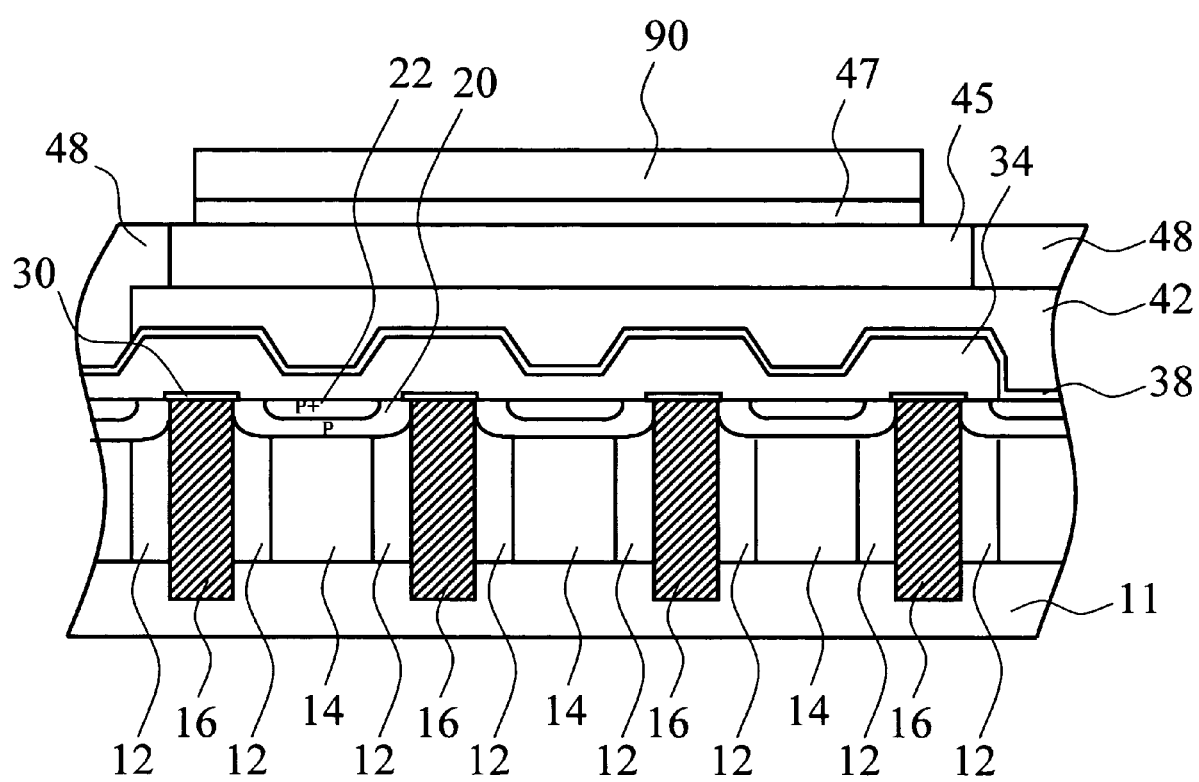
FIG. 9 is a section view of an area of the gate electrode pad.

FIG. 9 is a section view of an area of the gate electrode pad. In this area, the gate electrode 32 is insulated from a source electrode by the insulating interlayer film 34, and the gate electrode pad 45 is laminated on the gate wiring 42. The circumference of the gate electrode pad 45 is covered with the protective film 48 which consists of polyimide etc. The gate electrode pad 45 can be made by plating. On the gate electrode pad 45, the gate plate 90 which consists of copper (Cu) etc. is connected via solder 47.

Figure 10:
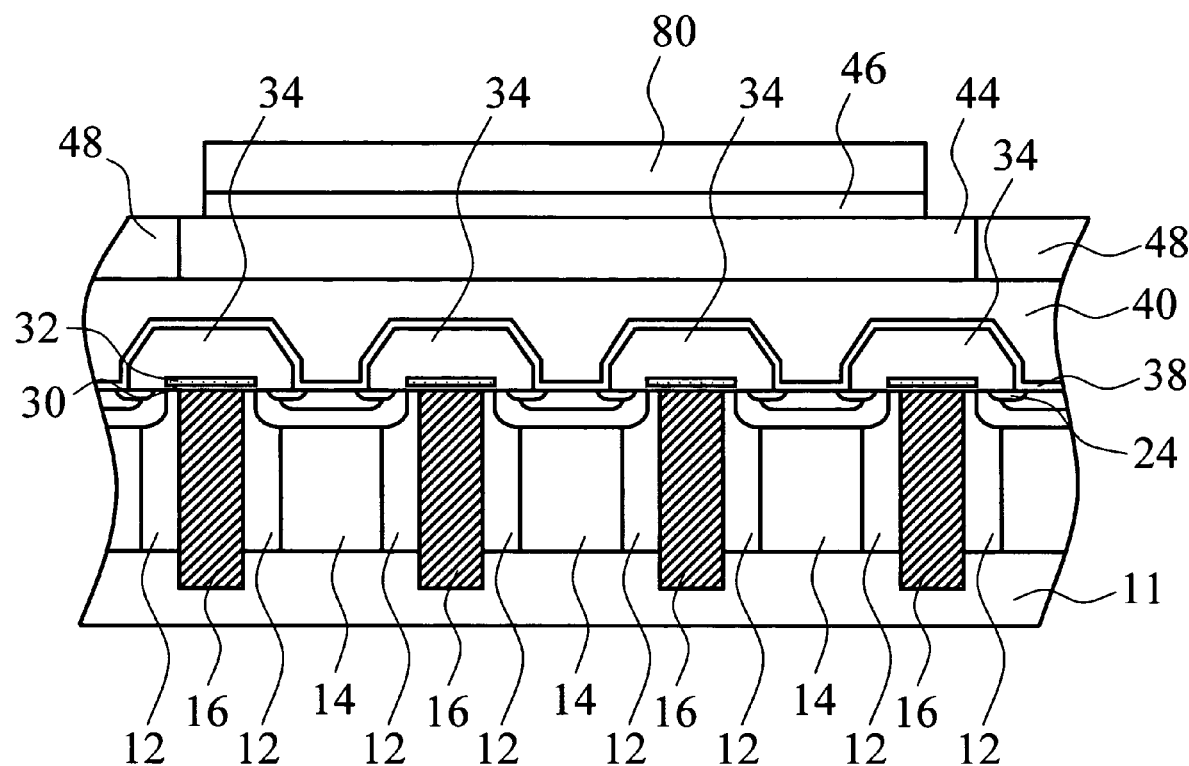
FIG. 10 is a schematic diagram showing the cross-sectional structure of the source electrode pad 44.

FIG. 10 is a schematic diagram showing the cross-sectional structure of the source electrode pad 44. In this area, the gate electrodes 32 are covered with the insulating interlayer films 34, and the source wiring layer 40 is connected to the source region 24. The source electrode pad 44 is provided on the source wiring layer 40, and the circumference of the source electrode pad 44 is covered with the protective film 48. On the source electrode pad 44, the source plate 80 which consists of copper (Cu) etc. is connected via solder 46.

In the case of the semiconductor element 10 explained above, according to this embodiment, the semiconductor device excellent in reliability or a manufacture yield can be offered by making the leading-out direction of the source plate 80 and the gate plate 90 substantially parallel to the longitudinal direction of the trenches 16 as expressed in FIG. 1.

On the other hand, in the case of the comparative example expressed in FIG. 6, there is a problem that mechanical load tends to be applied to the part of the semiconductor mesa inserted into the trenches 16.

Figure 11:
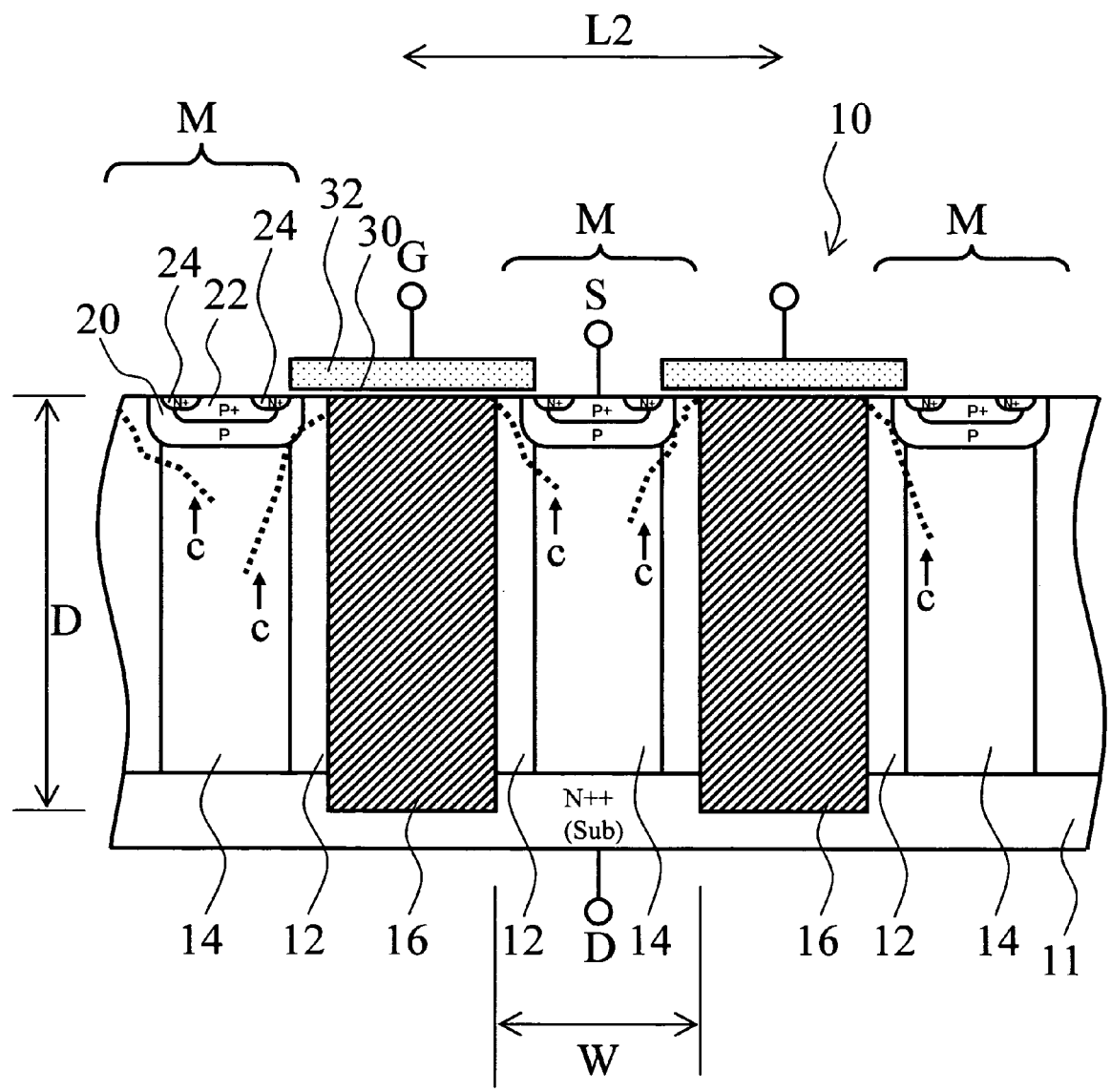
FIG. 11 is a schematic section view illustrating the cracks generated under the source electrode pad or the gate electrode pad in the semiconductor device of the comparative example.

FIG. 11 is a schematic section view illustrating the cracks generated under the source electrode pad or the gate electrode pad in the semiconductor device of the comparative example. That is, in the case of the comparative example, the tendency which the cracks C generate near the upper ends of the n-type pillar regions 12 which adjoin the trenches 16 under the electrode pads 44 and 45 was found. This is considered to be because that mechanical load is applied in the process of connecting the source plate 80 and the gate plate 90 to the electrode pads or the process of sealing with resin 200 after that.

Generally, when connecting the source plate 80 and the gate plate 90 to the semiconductor element, it is thought that mechanical stress, vibration, a shock, etc. are easy to be given along the leading-out direction of the source plate 80 or the gate plate 90. That is, in FIG. 6, these stresses are easy to be applied along the direction of an arrow L2. As a factor of such stresses, a thrust applied when the source plate 80 and the gate plate 90 are connected, a stress resulting from thermal expansion or contraction of the source plate 80 and the gate plate 90, a fluid power applied when sealing with the resin 200 and a distortion stress generated when the resin 200 hardens can be mentioned, for example.

For these various kinds of factors, the stresses vibration, a shock, etc. applied to the source plate 80 or the gate plate 90 are applied in the direction of the arrow L2 in FIG. 11. In DTMOS, the trenches 16 filled up with the insulators are provided densely on the surface. And among these trenches 16, semiconductor mesas M with narrow widths exist. In DTMOS illustrated in FIG. 11, a semiconductor mesa M consists of a pair of n-type pillar regions 12 and a p-type pillar region 14 provided between them. The width W of this semiconductor mesa M is as narrow as about 10 micrometers, and on the other hand, the height D may amount to 60 micrometers or more. That is, the mesas M with narrow width and high height are formed densely on the surface of the semiconductor element 10.

Figure 12:
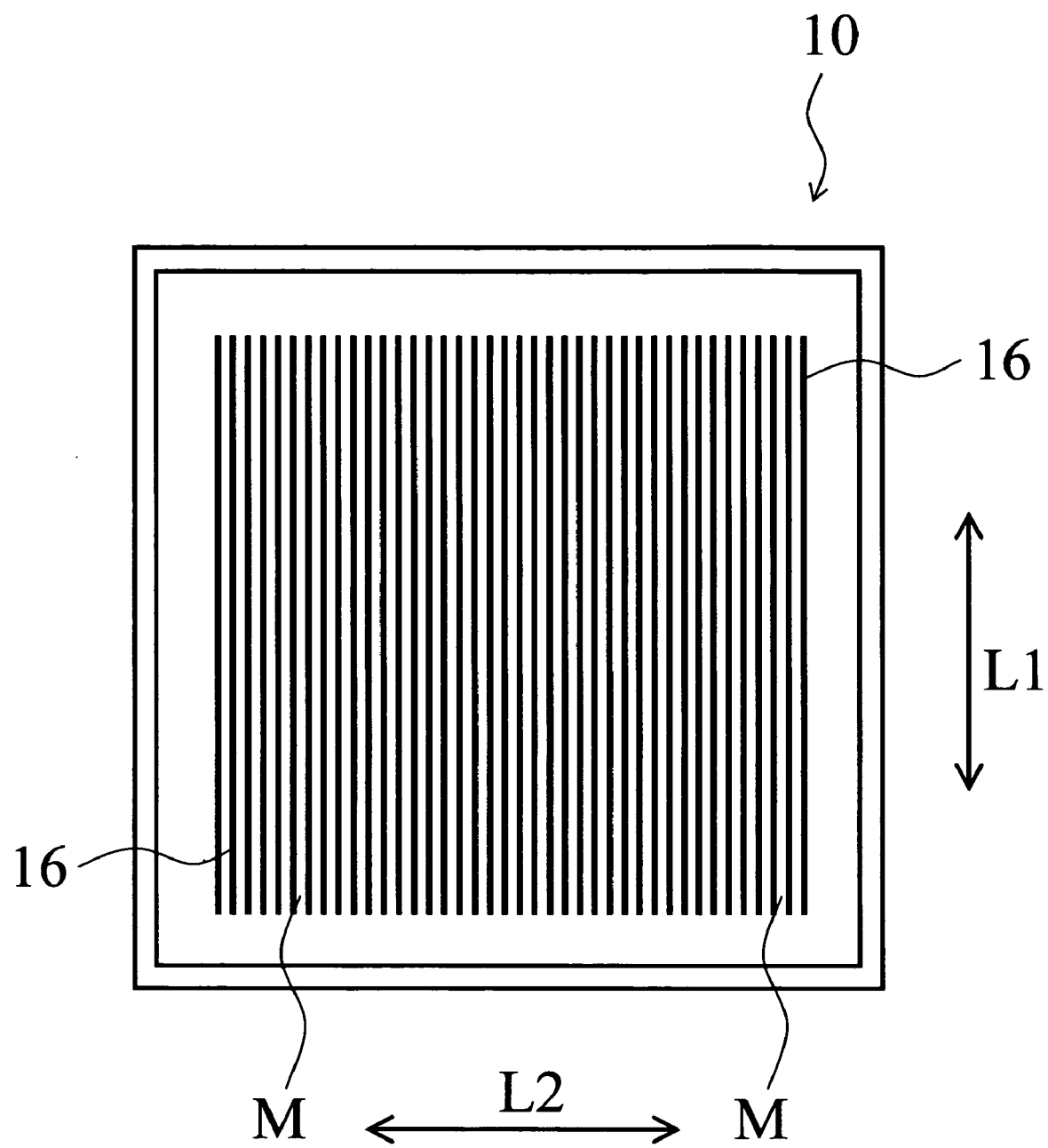
FIG. 12 is a schematic diagram showing the direction of the stress applied to the semiconductor mesas M.

FIG. 12 is a schematic diagram showing the direction of the stress applied to the semiconductor mesas M. That is, it is thought that when stress, vibration, the shock, etc. are loaded to the semiconductor mesas M extending in one direction along the perpendicular direction L2 to the longitudinal direction, the cracks C etc. are easy to be generated in the mesas M as illustrated in FIG. 11. When such cracks C etc. is generated in the semiconductor mesas M, current leak will increase and a breakdown voltage will fall. Consequently, it may become a problem that the initial characteristic deteriorates, a manufacture yield fall, and a life of the element becomes short.

In contrast to this, according to this embodiment, by making the leading-out direction of the source plate 80 and the gate plate 90 substantially parallel to the longitudinal direction of the trenches 16 as expressed in FIG. 1, the direction L1 in which the stress is applied will be parallel to the longitudinal direction of the semiconductor mesas M. As the result, even if the semiconductor mesas M which have narrow width and high height are formed, the cracks etc. become hard to be generated, and the initial characteristic and reliability are also stabilized.

The Inventors made the semiconductor device expressed in FIG. 1 and the semiconductor device of the comparative example expressed in FIG. 6 as an experiment, and examined them respectively. As a result, in the semiconductor device of the comparative example, there were samples which had the high breakdown voltage and the high current leaks and did not fulfill specification. In contrast to this, in the semiconductor device of the invention, the breakdown voltage and the amount of current leaks of all samples which were evaluated were low enough, and the manufacture yield of about 100% was obtained.

Moreover, the Inventors made the samples whose leading-out direction of the source plate 80 incline for various angles to the longitudinal direction of the semiconductor mesas M, i.e., the longitudinal direction of the trenches 16, and evaluated the characteristic of them.

Figure 13:
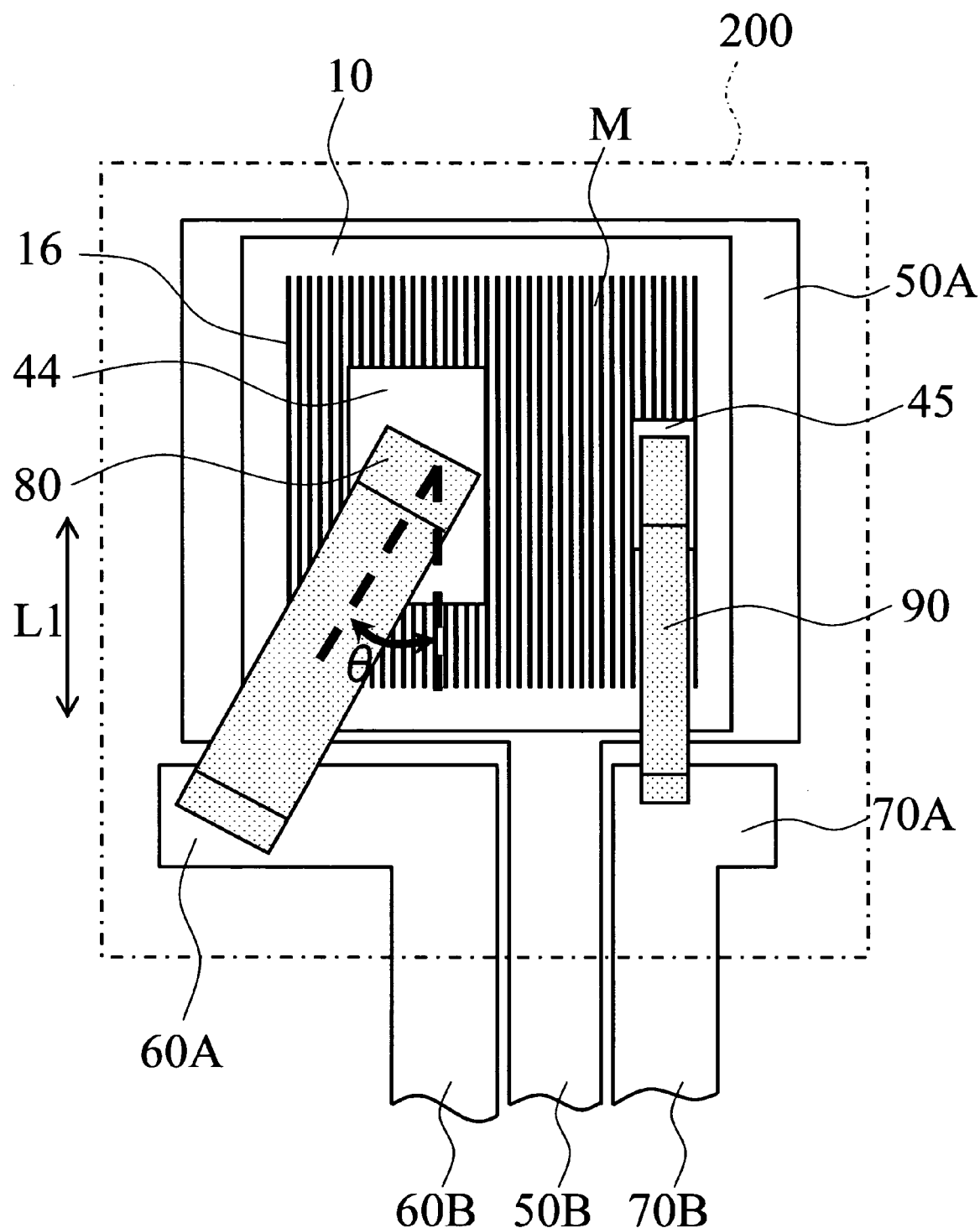
FIG. 13 is a schematic diagram illustrating the sample which the Inventors made as an experiment.

FIG. 13 is a schematic diagram illustrating the sample which the Inventors made as an experiment. That is, the sample whose leading-out direction of the source plate 80 incline for angle θ to the longitudinal direction of the semiconductor mesa M was made as an experiment. As a result, it turned out that the good characteristic and a manufacture yield are obtained in general when degrees of inclined angle θ was 45 or less.

The invention is effective also when ultrasonic bonding is used.

Figure 14:
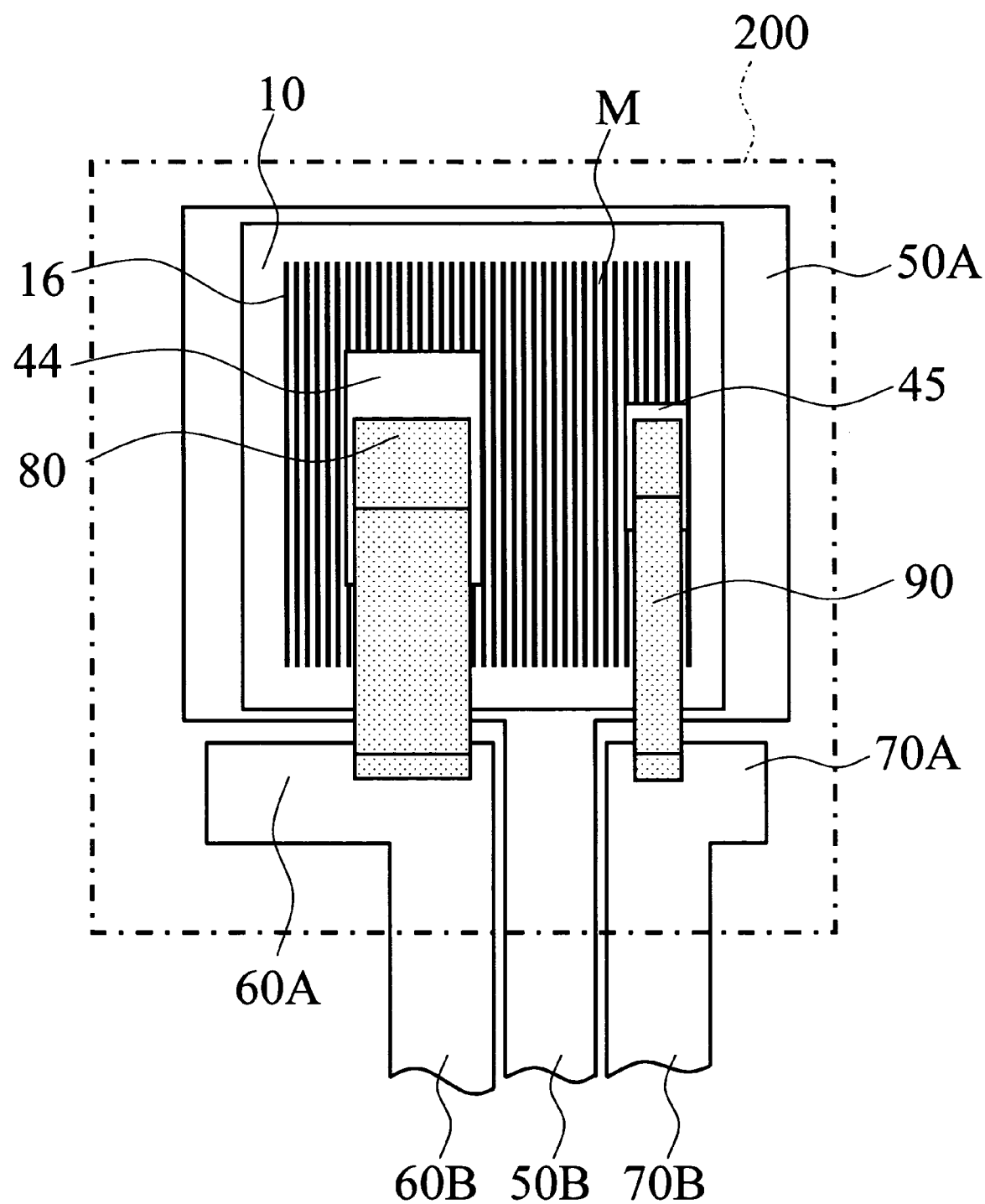
FIG. 14 is a schematic plan view showing the example in which the source plate 80 and the gate plate 90 are connected by ultrasonic bonding.

FIG. 14 is a schematic plan view showing the example in which the source plate 80 and the gate plate 90 are connected by ultrasonic bonding.

Figure 15:
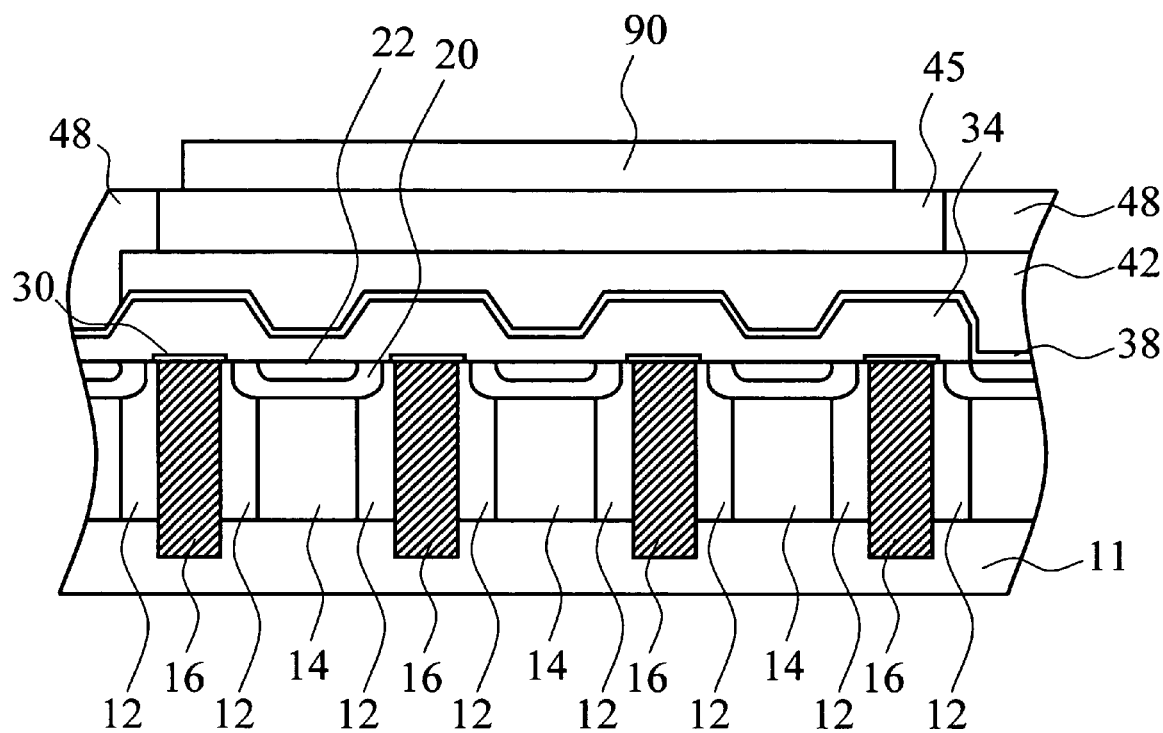
FIG. 15 is a schematic diagram showing the cross-sectional structure of the contact area of the gate plate 90 of the semiconductor device of this example.

FIG. 15 is a schematic diagram showing the cross-sectional structure of the contact area of the gate plate 90 of the semiconductor device of this example.

Figure 16:
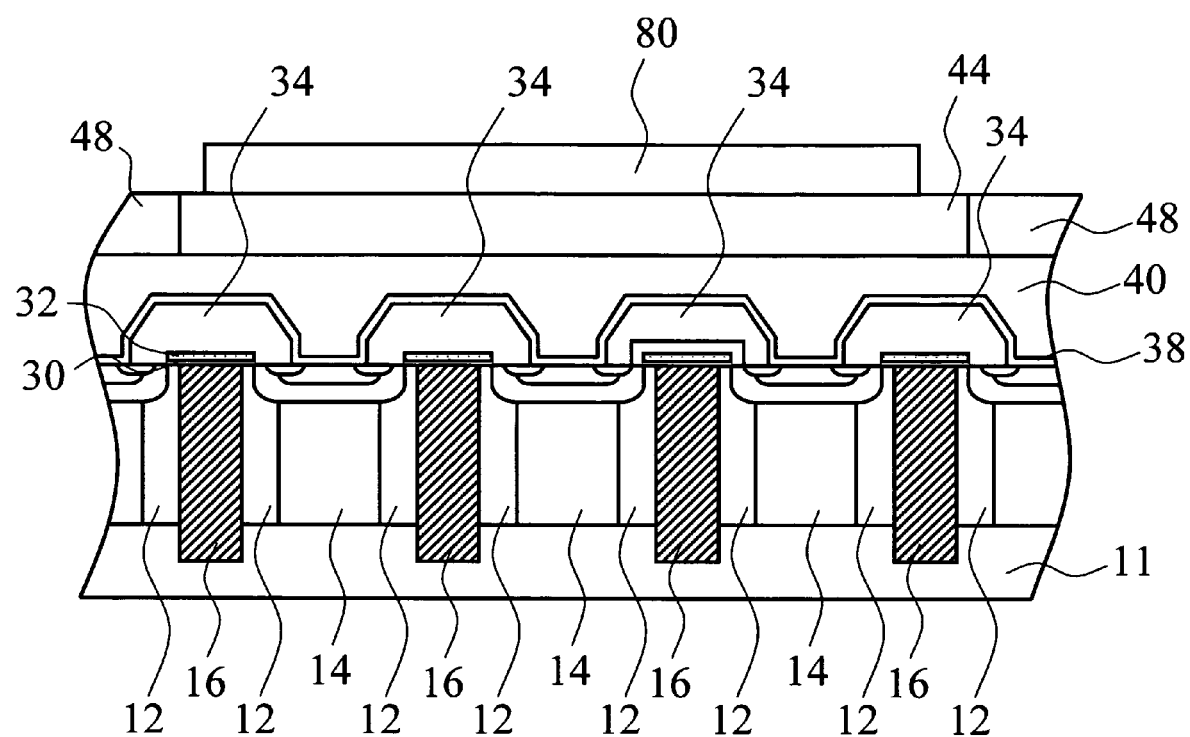
FIG. 16 is a schematic diagram showing the cross-sectional structure of the contact area of the source plate 80 of the semiconductor device of this example.

FIG. 16 is a schematic diagram showing the cross-sectional structure of the contact area of the source plate 80 of the semiconductor device of this example.

That is, in this example, the gate plate 90 is connected on the gate wiring layer 42 by the ultrasonic bonding. For example, the gate wiring layer 42 is formed by aluminum (Al) and the ultrasonic bonding is carried out onto the surface of the gate wiring layer 42 by applying an ultrasonic wave to the gate plate 90 which is consisted of aluminum (Al).

Similarly, the source wiring layer 40 is formed by aluminum (Al) and the ultrasonic bonding is carried out onto the surface of the source wiring layer 40 by applying an ultrasonic wave to the source plate 80 which is consisted of aluminum (Al).

Thus, when the bonding is carrying out by applying the ultrasonic wave, big stress is easy to be applied to the semiconductor mesas M under the contact area. In contrast to this, according to the invention, for making the leading-out direction of the source plate 80 and the gate plate 90 substantially parallel to the longitudinal direction of the trenches 16, the damage because of bonding can be controlled and the good initial characteristic, reliability, and a high yield can be obtained.

Furthermore, the invention can be applied similarly when bonding by wire, and the same effect can be acquired.

Figure 17:
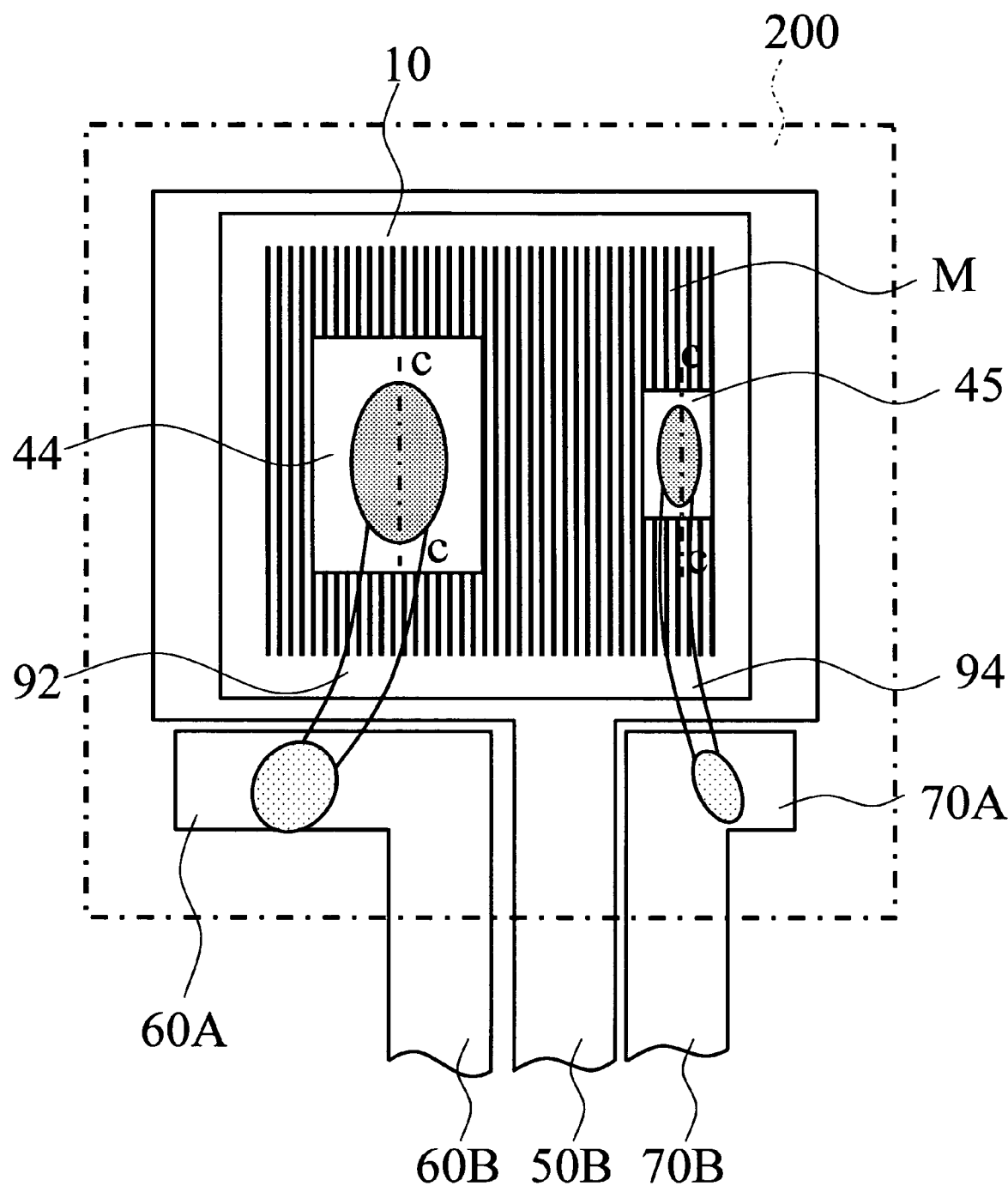
FIG. 17 is a schematic plan view showing the semiconductor device to which the source electrode pad and the gate electrode pad are bonded with wire.

FIG. 17 is a schematic plan view showing the semiconductor device to which the source electrode pad and the gate electrode pad are bonded with wire. That is, in this example, the wire 92 connects the source electrode pad 44 and inner lead 60A. Moreover, the wire 94 connects the gate electrode pad 45 and inner lead 70A.

As these wires 92 and 94, aluminum (Al), gold (Au), etc. whose thicknesses are about 400 micrometers can be used, for example. These wires can be bonded to the electrode pads 44 and 45 by ultrasonic bonding, respectively. Since a plurality of wires are connectable to one electrode pad, current capacity, mechanical reliability, etc. can also be raised further.

In this example, the leading-out direction of wires 92 and 94 are substantially parallel to the longitudinal direction of the trenches 16 of the semiconductor element 10. So, under the electrode pads 44 and 45, generating of the cracks of the semiconductor resulting from mechanical stress, vibration, a shock, etc. can be controlled. As the result, problems, such as a fall of current leak and a breakdown voltage, or a fall of reliability, can be controlled, and the excellent initial characteristic, a high manufacture yield and high reliability can be acquired.

In addition, when wires are used, the "leading-out direction" means not necessarily a direction connecting the contact area between one end of the wire and the other end of the wire, but a direction of an axial center of the wire in the contact area in the source electrode pad 44 or the gate electrode pad 45. That is, in the example expressed in FIG. 17, the direction of a C-C line which is the direction of an axial center of the contact area of the wire 92 in the source electrode pad 44 is a "leading-out direction" of the wire 94. Similarly, in the gate electrode pad 45, the direction of a C-C line which is the direction of an axial center of the contact area of the wire 94 is the "leading-out direction" of the wire 94.

Figure 18:
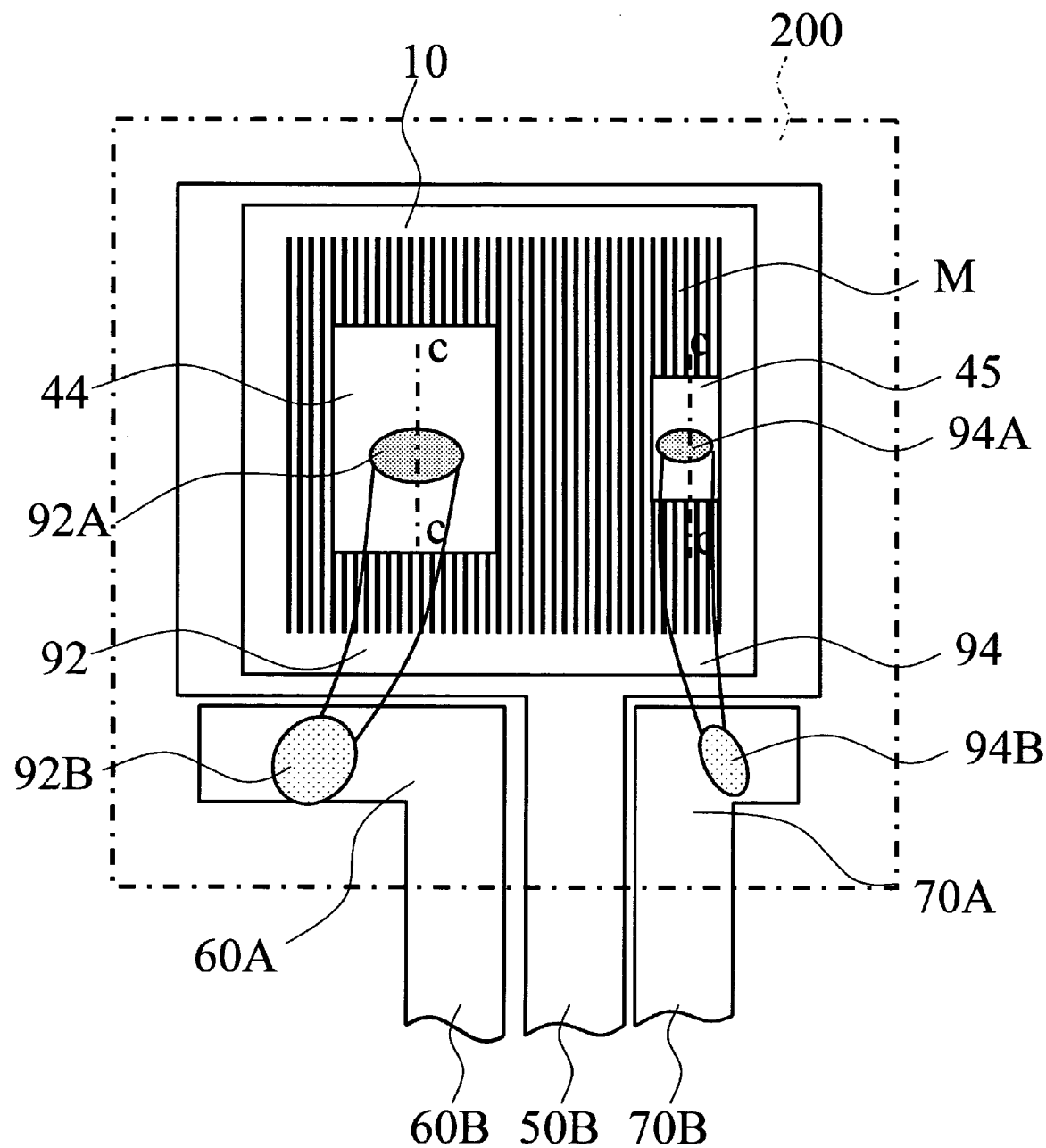
FIG. 18 is a schematic plan view showing the second example in which the wire is used.

FIG. 18 is a schematic plan view showing the second example in which the wires are used. In the case of this example, in the source electrode pad 44 and the gate electrode pad 45, the form of the contact parts 92A, 94A of wires 92 and 94 are in ellipse fashion extended in the diameter direction of the wires. Also in such a case, the "leading-out direction" of wires 92 and 94 shall be the directions of a C-C line which are in directions of an axial center.

Further, in the case of the example, the areas of the contact parts 92B, 94B of wires 92, 94 with the inner leads 60A, 70A are greater than the areas of the contact parts 92A, 92B of the wires 92, 94 with the pads 44, 45, respectively. Thus, more reliable electrical contacts may be obtained at the inner leads 60A, 70A.

Figure 19:
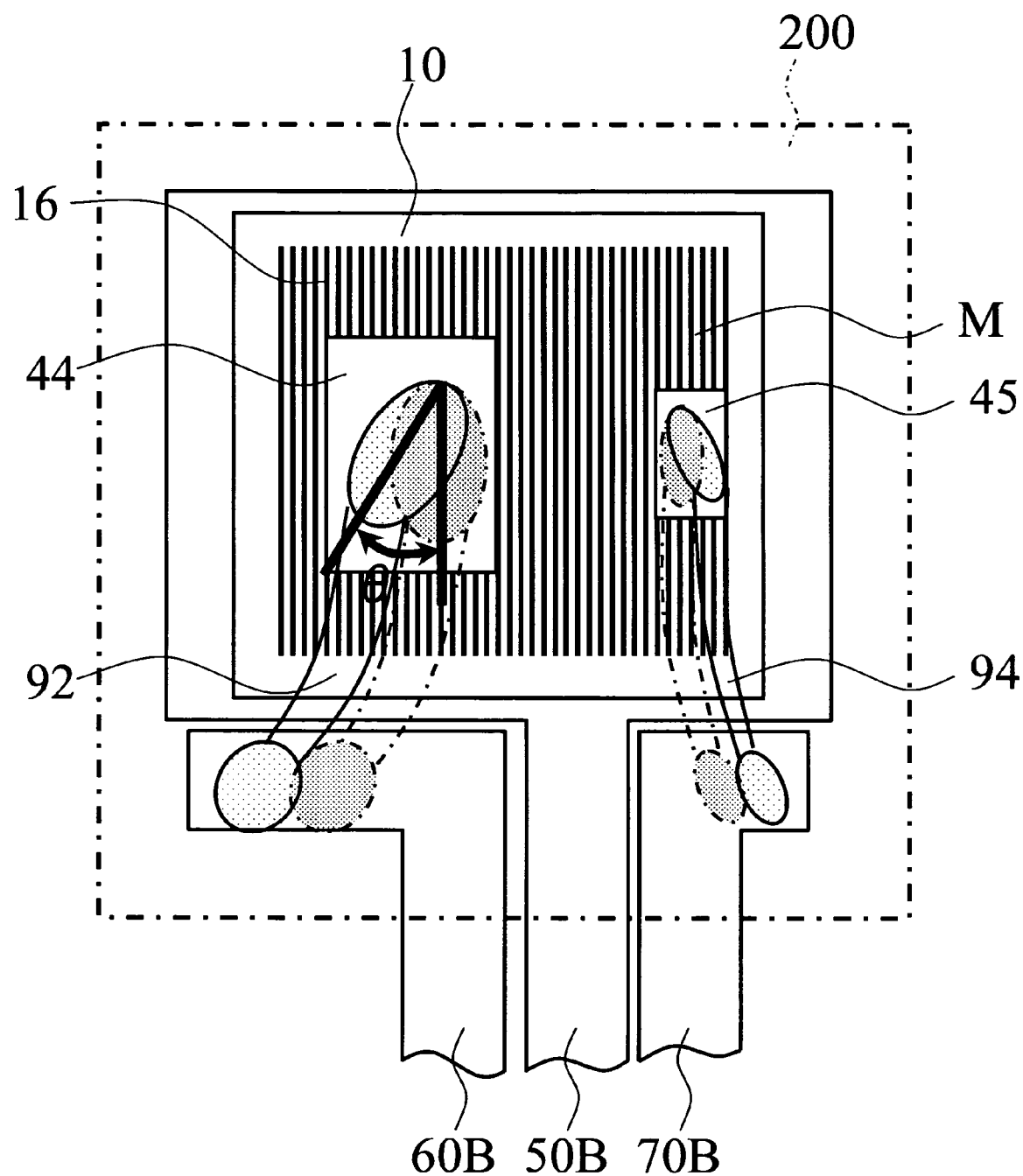
FIG. 19 is a schematic plan view showing the example in which the leading-out direction of the wires incline.

FIG. 19 is a schematic plan view showing the example in which the leading-out direction of the wires inclines. In this example, the leading-out directions of the wires 92 and 94, i.e., the leading-out directions of the C-C line which are the directions of axial centers in the contact parts, incline for only angle θ to the longitudinal direction of the trenches 16. Also in this case, as explained above about FIG. 13, by making the leading-out directions incline for less than 45 degrees, it becomes possible to let a pressure and vibration generated at the time of bonding of the wires 92 and 94, and a stress applied when the resin 200 is sealed and hardened be released toward a longitudinal direction of the semiconductor mesas M. As the result, generating of cracks etc. can be suppressed in the semiconductor mesas M, and the excellent initial characteristic, high reliability, and a high manufacture yield can be realized.

Figure 20:
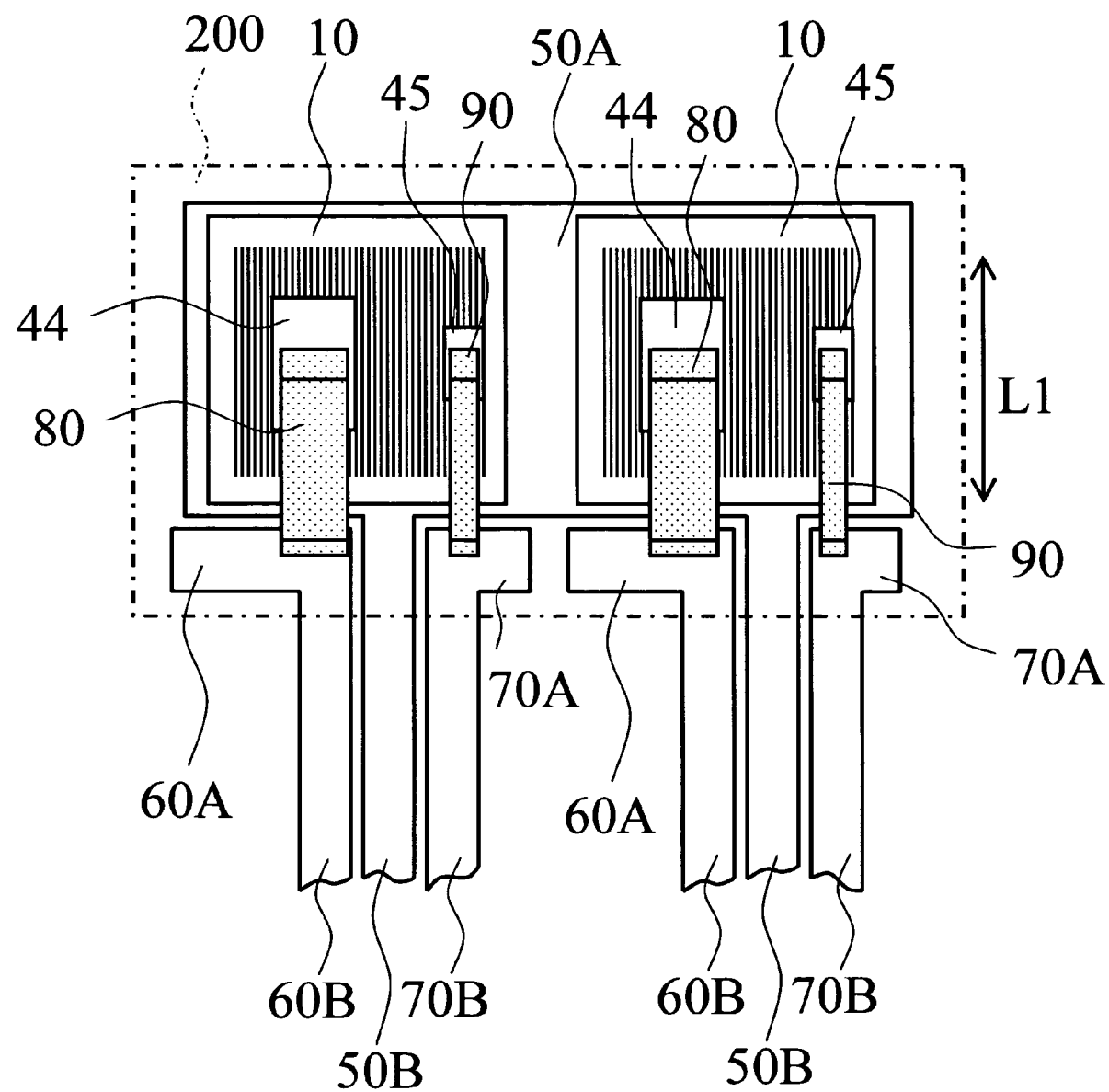
FIG. 20 is a schematic plan view showing another example of the invention.

FIG. 20 is a schematic plan view showing another example of the invention. In this example, a plurality of semiconductor elements 10 is mounted on one package. That is, two semiconductor elements 10 are mounted on the inner lead 50A. The drain electrodes on the back side of these semiconductor elements 10 are connected common to the inner lead 50A. And, the source electrode pad 44 and the gate electrode pad 45 are provided in each semiconductor element 10, and these pads and the inner leads 60A and 70A are connected by the source plate 80 and the gate plate 90. As expressed in FIGS. 9 and 10, they may be connected by solder, or as expressed in FIGS. 14 and 16, they may be connected by ultrasonic bonding. Moreover, the wires 92 and 94 may be used instead of the source plate 80 and the gate plate 90, as expressed in FIG. 17 through FIG. 19.

Such a semiconductor device can be used as a switching element of the charge-and-discharge circuit of a lithium ion battery.

Figure 21:
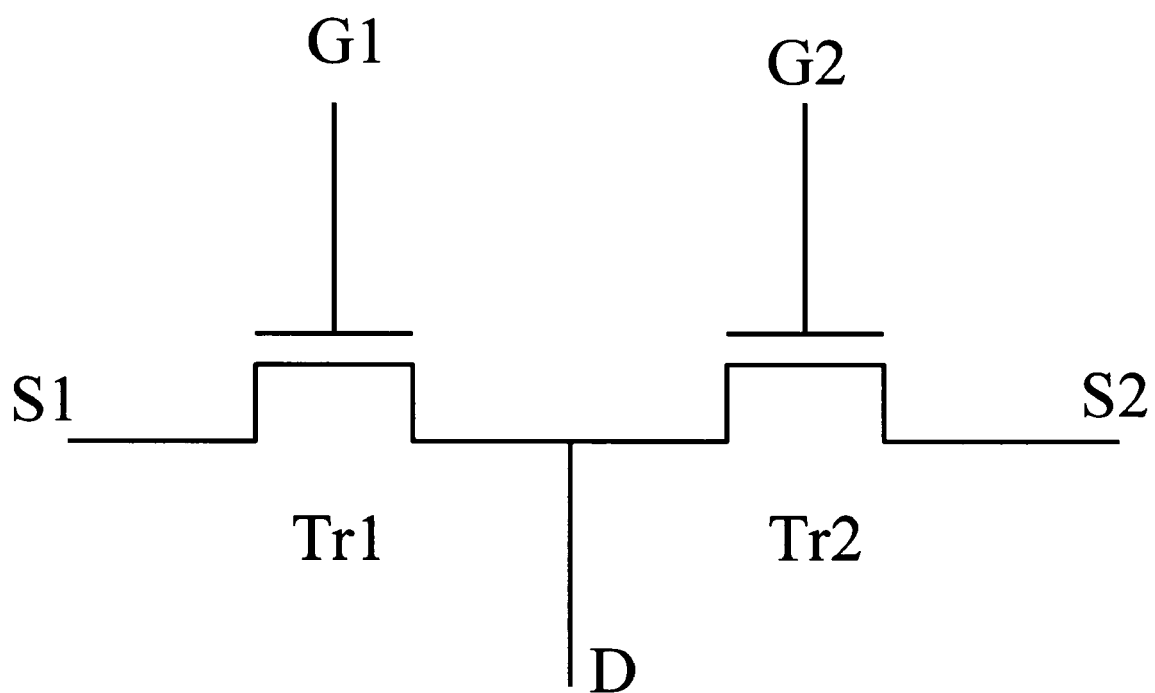
FIG. 21 is a schematic diagram showing the equivalent circuit of the semiconductor device of this example.

FIG. 21 is a schematic diagram showing the equivalent circuit of the semiconductor device of this example. That is, the drains of two transistors Tr1 and Tr2 are commonly connected. In this circuit, the transistor Tr1 can be used as a switching element for opening and closing of a charge circuit, and the transistor Tr2 can be used as a switching element for opening and closing of an electric discharge circuit. According to this example, the low battery drive system of power consumption is realizable by carrying DTMOS with low ON resistance and a high breakdown voltage.

Also in this example, by making the leading-out direction of the source plate 80 and the gate plate 90 substantially parallel to the longitudinal direction of the trenches 16, the pressure, vibration and shock loaded to the semiconductor mesas when connecting, sealing with resin and hardening of resin can be released toward the longitudinal direction of the mesas M. As the result, the excellent initial characteristic, high reliability, a high manufacture yield, etc. can be obtained.

Especially, if the invention is applied to a battery drive type system, the invention has an advantageous at the point that generating of the leak current by damage on the semiconductor mesa M etc. is controlled, and the power consumption of a system can be reduced further.

Figure 22:
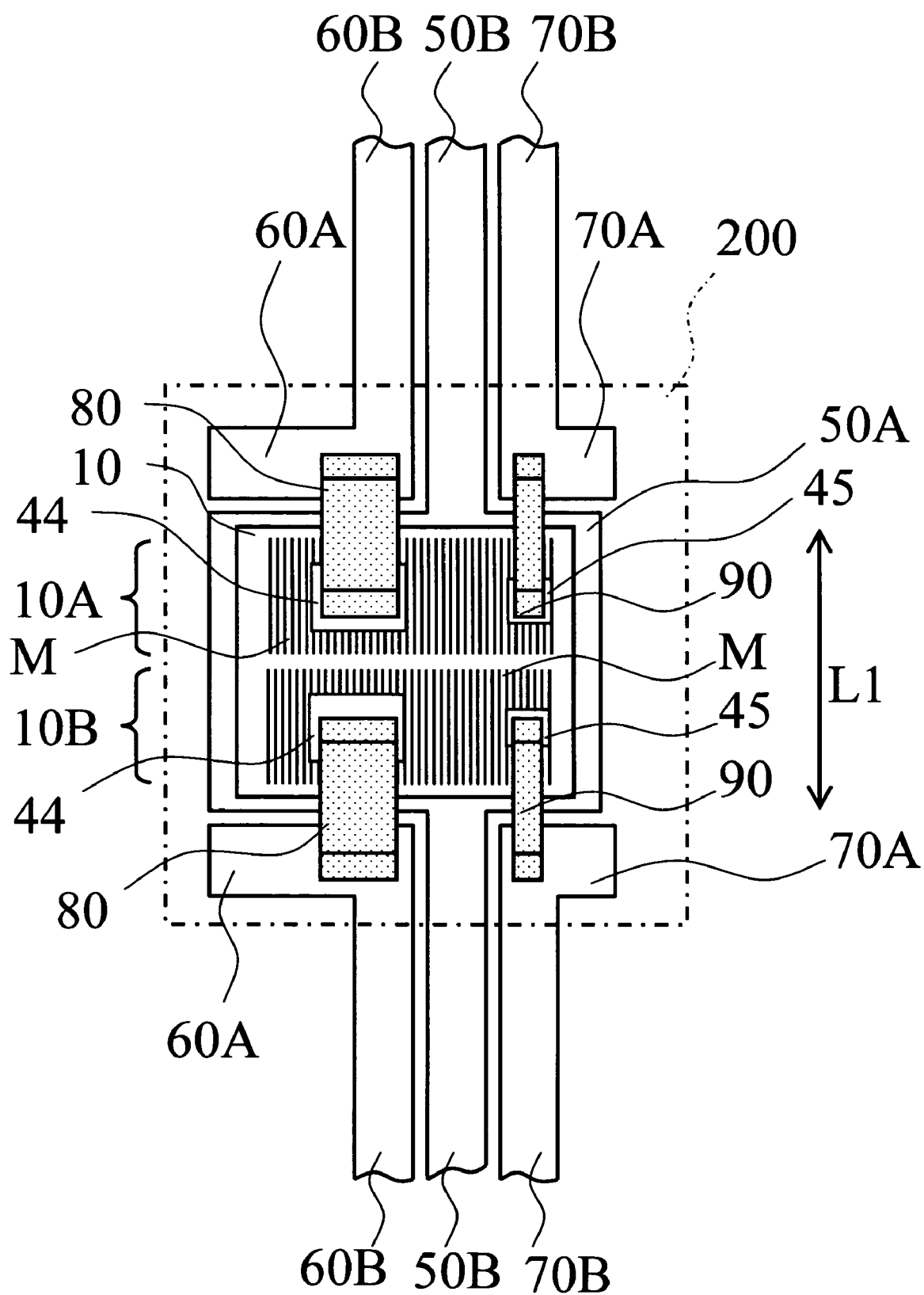
FIG. 22 is a schematic plan view showing another example of the invention.

FIG. 22 is a schematic plan view showing another example of the invention. In this example, a plurality of semiconductor element parts are integrated on one semiconductor element 10. That is, first element part 10A and second element part 10B are provided in the semiconductor element 10. The drain electrodes on the back side of these element parts 10A and 10B are connected commonly to the inner lead 50A.

Moreover, the source electrode pad 44 and the gate electrode pad 45 are provided in the element parts 10A and 10B, respectively. The sources electrode pad 44 and the gate electrode pad 45 are connected to inner leads 60A and 70A by the source plate 80 and the gate plate 90. As expressed in FIGS. 9 and 10, they may be connected by solder, or as expressed in FIG. 14 through FIG. 16, they may be connected by ultrasonic bonding. Moreover, the wires 92 and 94 may be used instead of the source plate 80 and the gate plate 90, as expressed in FIG. 17 through FIG. 19.

The semiconductor device of this example also has the same equivalent circuit as the semiconductor device expressed in FIG. 21. Therefore, for example, when the semiconductor device of this example is used for the charge-and-discharge circuit of a lithium ion battery etc., the same effect as what was mentioned above about this FIG. is acquired. Also in this example, by making the leading-out direction of the source plate 80 and the gate plate 90 substantially parallel to the longitudinal direction of the trenches 16, the pressure, vibration and shock loaded to the semiconductor mesas when connecting, sealing with resin and hardening of resin can be released toward the longitudinal direction of the mesas M. As the result, the excellent initial characteristic, high reliability, a high manufacture yield, etc. can be obtained.

Figure 23:
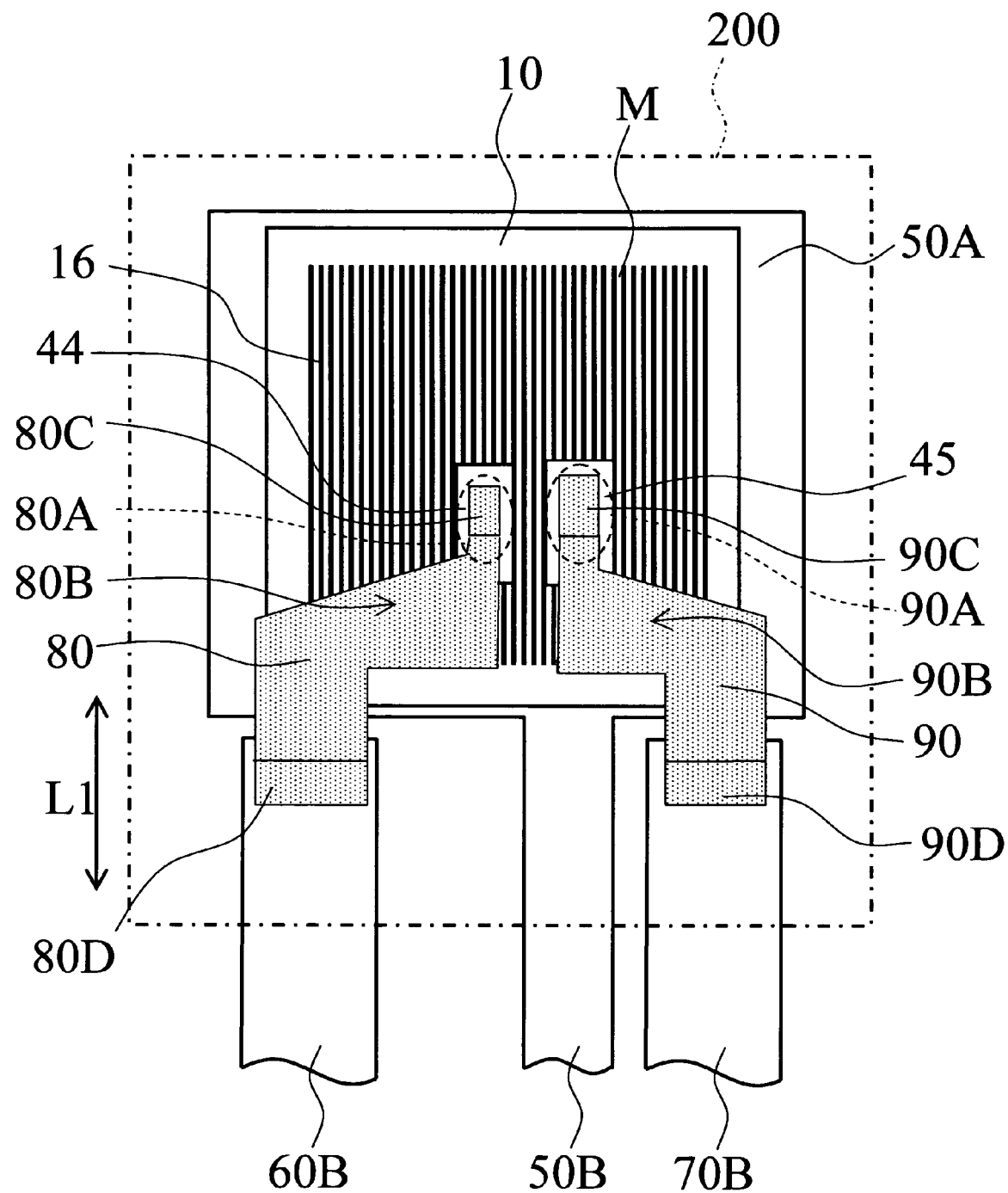
FIG. 23 is a schematic plan view showing another example of the invention.

FIG. 23 is a schematic plan view showing another example of the invention. In this example, the source plate 80 and the gate plate 90 do not have a straight stripe form but the crooked form, respectively. That is, the source plate 80 has lead-outer part 80A connected to the source electrode pad 44, and extension part 80B extending from lead-outer part 80A. The extension part 80B extends in a transverse direction from the lead-outer part 80A, extends parallel to the leading-out direction and connected to the inner lead 60A.

Similarly, the gate plate 90 also has lead-outer part 90A connected to the gate electrode pad 45, and extension part 90B extending from lead-outer part 90A. The extension part 90B extends in a transverse direction from the lead-outer part 90A, extends parallel to the leading-out direction and connected to the inner lead 70A.

In the case of this example, the "leading-out direction" of the source plate 80 and the gate plate 90 are determined according to the forms of the leading-out parts 80A and 90A. That is, the lead-outer parts 80A and 90A are extending in the direction parallel to the arrow L1, respectively, when seen from the contact parts with the source electrode pad 44 and the gate electrode pad 45. That is, the source plate 80 and the gate plate 90 have leading-out direction substantially parallel to the trenches 16, respectively.

Further, in the case of the example, the areas of the contact parts 80D, 90D of the plates 80, 90 with the inner leads 60A, 70A are greater than the areas of the contact parts 80C, 90C of the plates 80, 90 with the pads 44, 45, respectively, as explained with reference to FIG. 18. Thus, more reliable electrical contacts may be obtained at the inner leads 60A, 70A.

Heretofore, the embodiments of the present invention have been explained, referring to the examples. However, the present invention is not limited to these specific examples.

For example, also concerning the method and condition of material, conduction type, carrier concentration, impurities, thickness, arrangement relations, manufacturing method, in each process, those skilled in the art will be able to carry out the invention appropriately selecting a material or a structure within known techniques.

What is claimed is:

1. A semiconductor device comprising:
  a semiconductor element having:
  a semiconductor substrate having first and second major surfaces;
  a semiconductor layer formed on the first major surface of the semiconductor substrate;
  a plurality of trenches formed on the semiconductor layer, the trenches being parallel to each other and extending to a first direction;
  a filling material filling the trenches;
  a first electrode pad provided on the semiconductor layer and connected electrically to a first major electrode;
  a second major electrode provided on the second major surface; and
  a gate electrode pad provided on the semiconductor layer and connected to a gate electrode which controls conduction between the first major electrode and the second major electrode; and
  a conductive member connected to at least one of the first electrode pad and the gate electrode pad via a first contact area, a leading-out direction of the conductive member being substantially parallel to the first direction.

2. The semiconductor device according to claim 1, further comprising a resin sealing the semiconductor element.

3. The semiconductor device according to claim 1, wherein
the semiconductor layer has first pillar regions of a first conduction type adjoining the trenches and second pillar regions of a second conduction type adjoining the first pillar regions,
base regions of the second conduction type are formed on a surface of the second pillar regions, and
diffusion regions are formed on surfaces of the base regions, the diffusion regions being connected electrically to the first major electrode.

4. The semiconductor device according to claim 1, further comprising a lead, wherein the conductive member is connected to the lead via a second contact area.

5. The semiconductor device according to claim 4, wherein;
a direction connecting a barycenter point of the first contact area and a barycenter point of the second contact area is substantially parallel to the first direction.

6. The semiconductor device according to claim 4, wherein the conductive member is a metal plate, and the first contact area is smaller than the second contact area.

7. The semiconductor device according to claim 1, wherein;
the conductive member is a metal plate,
the metal plate includes a leading-out portion extending from the first contact area toward the leading-out direction, and an extending portion extending from the leading-out portion, and
the extending portion extends toward a direction different from the leading-out direction.

8. The semiconductor device according to claim 1, wherein the conductive member is a metal plate, and the metal plate is connected at the first contact area by a solder.

9. The semiconductor device according to claim 1, wherein the conductive member is a metal plate, and the metal plate is connected at the first contact area by an ultrasonic bonding.

10. The semiconductor device according to claim 1, wherein the conductive member is a metal wire, and is connected at the first contact area by an ultrasonic bonding.

* * * * *